US011908877B2

(12) United States Patent
Hamada

(10) Patent No.: US 11,908,877 B2
(45) Date of Patent: Feb. 20, 2024

(54) COLORED FILM, MANUFACTURING METHOD OF SAME, AND SOLID-STATE IMAGING ELEMENT

(71) Applicant: FUJIFILM Corporation, Tokyo (JP)

(72) Inventor: Daisuke Hamada, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 1205 days.

(21) Appl. No.: 16/558,838

(22) Filed: Sep. 3, 2019

(65) Prior Publication Data

US 2020/0006414 A1    Jan. 2, 2020

Related U.S. Application Data

(63) Continuation of application No. PCT/JP2018/009854, filed on Mar. 14, 2018.

(30) Foreign Application Priority Data

Mar. 31, 2017  (JP) ................................. 2017-070557

(51) Int. Cl.
*H01L 27/146* (2006.01)
*G02B 1/118* (2015.01)
(Continued)

(52) U.S. Cl.
CPC ........ *H01L 27/14623* (2013.01); *B29C 43/02* (2013.01); *G02B 1/118* (2013.01);
(Continued)

(58) Field of Classification Search
CPC ........... H01L 27/1462; H01L 27/14623; H01L 27/14621; H01L 27/14685;
(Continued)

(56) References Cited

U.S. PATENT DOCUMENTS

2003/0114589 A1    6/2003  Suetsugu et al.
2012/0199727 A1    8/2012  Kubota
(Continued)

FOREIGN PATENT DOCUMENTS

CN    1407405 A     4/2003
CN    102576093 A   7/2012
(Continued)

OTHER PUBLICATIONS

Rejection Decision dated May 11, 2022 from the China National Intellectual Property Administration in CN Application No. 201880019470.9.
(Continued)

*Primary Examiner* — Derek S. Chapel
(74) *Attorney, Agent, or Firm* — Sughrue Mion, PLLC

(57) ABSTRACT

A colored film has an uneven structure on a surface thereof, in which an average distance between adjacent projections in the uneven structure is equal to or shorter than 1,500 nm, a standard deviation of the distance between the adjacent projections is 10 to 300 nm, and 95.00% or more of the projections satisfy Formula (1), in Formula (1), h represents a height of the projections, and D represents an average distance between the adjacent projections, Formula (1) $3h/D \geq 1.0$.

12 Claims, 5 Drawing Sheets

(51) Int. Cl.
  *G02B 5/22*     (2006.01)
  *G03F 7/00*     (2006.01)
  *B29C 43/02*    (2006.01)
  *G02B 5/00*     (2006.01)
  *G03F 7/039*    (2006.01)
  *B29K 33/00*    (2006.01)
  *B29K 105/00*   (2006.01)
  *B29L 31/34*    (2006.01)
  *G03F 7/16*     (2006.01)
  *G03F 7/20*     (2006.01)
  *G03F 7/32*     (2006.01)
  *G03F 7/40*     (2006.01)

(52) U.S. Cl.
  CPC .............. *G02B 5/003* (2013.01); *G02B 5/22* (2013.01); *G03F 7/0002* (2013.01); *G03F 7/0007* (2013.01); *G03F 7/0392* (2013.01); *H01L 27/14621* (2013.01); *H01L 27/14685* (2013.01); *B29K 2033/08* (2013.01); *B29K 2105/0032* (2013.01); *B29K 2909/14* (2013.01); *B29L 2031/3406* (2013.01); *G03F 7/162* (2013.01); *G03F 7/168* (2013.01); *G03F 7/2004* (2013.01); *G03F 7/325* (2013.01); *G03F 7/40* (2013.01)

(58) Field of Classification Search
  CPC ... H01L 27/14625; G02B 1/118; G02B 5/003; G02B 5/22; G03F 7/0002; G03F 7/0007; G03F 7/16; B29K 2105/0032
  See application file for complete search history.

(56) References Cited

U.S. PATENT DOCUMENTS

| | | | |
|---|---|---|---|
| 2014/0016202 A1 | 1/2014 | Toshima | |
| 2015/0153483 A1 | 6/2015 | Endoh et al. | |
| 2015/0160377 A1* | 6/2015 | Kuroda | G02B 27/0006 428/141 |
| 2016/0370580 A1 | 12/2016 | Takada et al. | |
| 2017/0363959 A1 | 12/2017 | Takahashi et al. | |
| 2017/0363968 A1* | 12/2017 | Solak | G03F 7/70466 |

FOREIGN PATENT DOCUMENTS

| | | |
|---|---|---|
| CN | 103460080 A | 12/2013 |
| CN | 104280793 A | 1/2015 |
| CN | 104335080 A | 2/2015 |
| CN | 104583812 A | 4/2015 |
| CN | 106062588 A | 10/2016 |
| JP | 2003-156849 A | 5/2003 |
| JP | 2005-076127 A | 3/2005 |
| JP | 2009-109572 A | 5/2009 |
| JP | 2009-276700 A | 11/2009 |
| JP | 2012-208391 A | 10/2012 |
| JP | 2012208391 A * | 10/2012 |
| JP | 2015-018178 A | 1/2015 |
| JP | 2016-091941 A | 5/2016 |
| WO | 2015/133431 A1 | 9/2015 |
| WO | 2016/158114 A1 | 10/2016 |

OTHER PUBLICATIONS

Communication dated Jan. 6, 2021, from China National Intellectual Property Administration in application No. 201880019470.9.
International Search Report dated May 29, 2018, issued by the International Searching Authority in corresponding application No. PCT/JP2018/009854.
Written Opinion dated May 29, 2018, issued by the International Searching Authority in corresponding application No. PCT/JP2018/009854.
International Preliminary Report on Patentability dated Oct. 1, 2019, issued by the International Bureau in corresponding application No. PCT/JP2018/009854.
Communication dated Oct. 25, 2021 from the Taiwanese Patent Office in Taiwanese Application No. 107109186.
Communication dated Aug. 25, 2020 from Japanese Patent Office in JP Application No. 2019-509215.
Office Action dated Nov. 17, 2021 from the China National Intellectual Property Administration in CN Application No. 201880019470.9.

* cited by examiner

12b

12c

COLORED FILM, MANUFACTURING METHOD OF SAME, AND SOLID-STATE IMAGING ELEMENT

CROSS-REFERENCE TO RELATED APPLICATIONS

This application is a Continuation of PCT International Application No. PCT/JP2018/9854, filed on Mar. 14, 2018, which claims priority under 35 U.S.C. § 119(a) to Japanese Patent Application No. 2017-070557, filed on Mar. 31, 2017. Each of the above application(s) is hereby expressly incorporated by reference, in its entirety, into the present application.

BACKGROUND OF THE INVENTION

1. Field of the Invention

The present invention relates to a colored film, a manufacturing method of the same, and a solid-state imaging element.

2. Description of the Related Art

In the related art, a colored film represented by a light blocking film is used for various purposes. For example, for the purpose of preventing the occurrence of noise, improving image quality, and the like, the light blocking film is disposed in the interior of a solid-state imaging element.

Regarding the colored film, various examinations are being carried out. For example, WO2015/133431A discloses a light blocking film having an uneven structure on the surface thereof so as to inhibit surface reflection.

SUMMARY OF THE INVENTION

In recent years, the level of performance required for the colored film has been further heightened. For example, it is required for the colored film to cause less reflection and not to increase a reflectance even under a condition by which the colored film is irradiated with light for a long period of time (hereinafter, these characteristics will be referred to as "light fastness" as well). That is, there is a demand for a colored film excellent in low reflection properties and light fastness.

As a result of conducting an examination regarding the colored film (light blocking film) described in WO2015/133431A, the inventors of the present invention have found that in order to satisfy both the low reflection properties and light fastness, the colored film needs to be further ameliorated.

An object of the present invention is to provide a colored film which exhibits excellent low reflection properties and light fastness. Another object of the present invention is to provide a manufacturing method of the colored film and a solid-state imaging element.

In order to achieve the above objects, the inventors of the present invention conducted an intensive examination. As a result, the inventors have found that the above objects can be achieved by the following constitution.

[1] A colored film having an uneven structure on a surface thereof, in which an average distance between adjacent projections in the uneven structure is equal to or shorter than 1,500 nm, a standard deviation of a distance between the adjacent projections is 10 to 300 nm, and 95.0% or more of the projections satisfy Formula (1).

$$3h/D \geq 1.0 \quad \text{Formula (1)}$$

in Formula (1), h represents a height of the projections, and D represents the average distance between the adjacent projections.

[2] The colored film described in [1], in which an optical density per thickness of 1.0 µm is equal to or higher than 0.5 at a wavelength within a wavelength range of 400 to 700 nm.

[3] The colored film described in [1] or [2], in which the average distance between the adjacent projections is 200 to 1,500 nm.

[4] The colored film described in any one of [1] to [3], in which the uneven structure includes projections that do not satisfy the requirement of Formula (1), and a density of the projections that do not satisfy the requirement of Formula (1) is 0.01 to 10/cm².

[5] The colored film described in any one of [1] to [4], in which the standard deviation of the distance between the adjacent projections is 15 to 300 nm.

[6] The colored film described in any one of [1] to [5], in which the standard deviation of the distance between the adjacent projections is 30 to 300 nm.

[7] The colored film described in any one of [1] to [6], in which an average of $3h/D$ of the projections is equal to or greater than 1.3.

[8] The colored film described in any one of [1] to [7], in which the projections have a shape tapered toward the tip.

[9] The colored film described in any one of [1] to [8] that is used as a light blocking film on a photosensor.

[10] A manufacturing method of the colored film described in any one of [1] to [8], including forming the colored film by a nanoimprinting method or a photolithography method.

[11] The manufacturing method of the colored film described in [10], in which the colored film is formed by the photolithography method, and a positive composition for forming a colored film is used.

[12] The manufacturing method of the colored film described in [10], in which the colored film is formed by the photolithography method, and exposure is performed through a mask having hexagonally arranged opening portions.

[13] A solid-state imaging element including the colored film described in any one of [1] to [8].

According to the present invention, it is possible to provide a colored film which exhibits excellent low reflection properties and light fastness.

Furthermore, according to the present invention, it is possible to provide a manufacturing method of the colored film and a solid-state imaging element.

DESCRIPTION OF THE PREFERRED EMBODIMENTS

Figure 1:
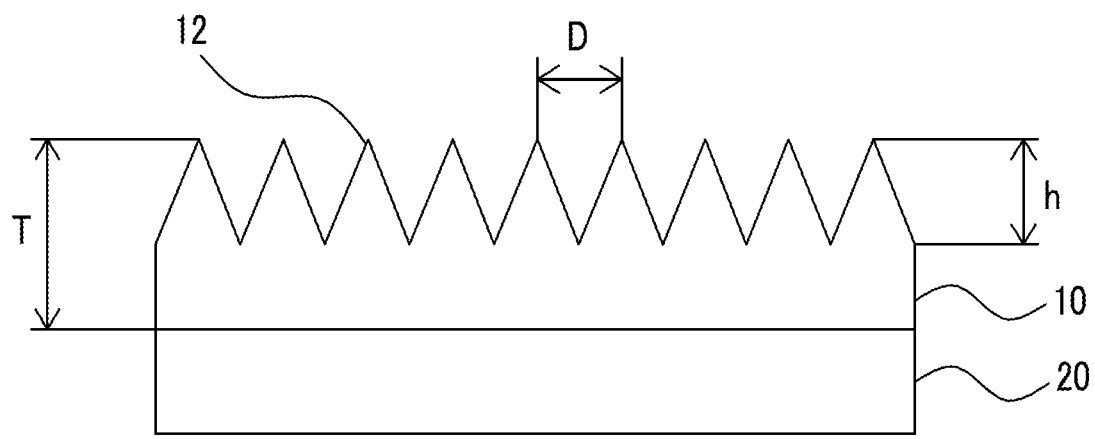
FIG. 1 is a cross-sectional view of an embodiment of a colored film.

Hereinafter, the present invention will be specifically described.

The following constituents will be described based on typical embodiments of the present invention, but the present invention is not limited to the embodiments.

In the present specification, a range of numerical values described using "to" means a range including the numerical values listed before and after "to" as a lower limit and an upper limit.

Regarding the description of a group (atomic group) in the present specification, in a case where there is no description about whether a group is substituted or unsubstituted, the group includes a group which does not have a substituent and a group which has a substituent. For example, "alkyl group" includes not only an alkyl group which does not have a substituent (unsubstituted alkyl group) but also an alkyl group which has a substituent (substituted alkyl group).

In the present specification, "actinic rays" or "radiation" means, for example, far ultraviolet rays, extreme ultraviolet (EUV), X-rays, electron beams, and the like. In addition, in the present specification, "light" means actinic rays and radiation. In the present specification, unless otherwise specified, "exposure" includes not only exposure by far ultraviolet rays, X-rays, EUV, and the like, but also lithography by particle beams such as electron beams and ion beams.

In the present specification, "(meth)acrylate" represents acrylate and methacrylate, "(meth)acryl" represents acryl and methacryl, "(meth)acryloyl" represents acryloyl and methacryloyl, and "(meth)acrylamide" represents acrylamide and methacrylamide. Furthermore, in the present specification, "tanryotai" in Japanese and "monomer" have the same definition. The monomer is classified into an oligomer and a polymer, and refers to a compound having a weight-average molecular weight equal to or smaller than 2,000. In the present specification, a polymerizable compound refers to a compound having a polymerizable group, and may be a monomer or a polymer. The polymerizable group refers to a group which takes part in a polymerization reaction.

The colored film according to an embodiment of the present invention has a predetermined uneven structure on a surface thereof. Accordingly, the colored film can satisfy both the low reflection properties and light fastness. The reason is assumed to be as below.

First, an average distance between adjacent projections in the uneven structure is equal to or shorter than 1,500 nm, and a proportion of projections satisfying Formula (1) is equal to or higher than 95.0% in all projections. Therefore, low reflection properties are achieved. Furthermore, because a standard deviation of a distance between the projections is 10 to 300 nm, light fastness is improved without deteriorating the low reflection properties. Particularly, regarding the light fastness, it is considered that because the standard deviation is within a predetermined range, reflectance may hardly change even though the shape of the colored film changes due to the prolonged light irradiation, and excellent light fastness may be obtained. In a case where the standard deviation is equal to or greater than 10 nm, reflectance hardly changes by a slight shape change of the colored film, and the light fastness becomes excellent. In a case where the standard deviation is equal to or smaller than 300 nm, reflectance can be further reduced.

<Colored Film and Manufacturing Method Thereof>

The colored film according to the embodiment of the present invention has an uneven structure on a surface thereof, in which an average distance between the adjacent projections in the uneven structure is equal to or shorter than 1,500 nm, a standard deviation of a distance between adjacent projections is 10 to 300 nm, and 95.0% or more of projections satisfy Formula (1).

$$3h/D \geq 1.0 \qquad \text{Formula (1)}$$

(h represents a height of the projections, and D represents an average distance between the adjacent projections.)

FIG. 1 is a cross-sectional view of an embodiment of the colored film. A colored film 10 is disposed on a substrate 20. The substrate 20 is an optional member and may not be used. Details of the substrate will be described later.

A surface (surface opposite to the substrate 20) of the colored film has an uneven structure. A distance between adjacent projections 12 is represented by D, and a height of the projections 12 is represented by h.

In the colored film 10, a plurality of projections 12 are two-dimensionally arranged, whereby an uneven structure is formed on the surface thereof. Examples of the arrangement of the projections will be specifically described later. It is preferable that the projections are regularly arranged at a predetermined pitch.

Furthermore, although the uneven structure is formed on one surface (main surface) of the colored film in FIG. 1, the uneven structure may be formed on both surfaces.

Although only nine projections 12 are shown in FIG. 1, the number of projections 12 is not limited to the aspect shown in FIG. 1. Generally, the number of projections 12 is preferably $1.0 \times 10^5$ to $1.0 \times 10^{15}/cm^2$, and more preferably $1.0 \times 10^7$ to $1.0 \times 10^{1}/cm^2$.

The average distance between adjacent projections in the uneven structure is equal to or shorter than 1,500 nm. Particularly, in view of further improving low reflection properties and/or light fastness (hereinafter, simply described as "in view of further improving the effects of the present invention" as well), the average distance is preferably 200 to 1,500 nm, and more preferably 200 to 900 nm.

The average distance is a value obtained by measuring a distance between adjacent projections at 100 or more spots by using a scanning electron microscope and calculating the arithmetic mean thereof. A standard deviation σ, which will be described later, showing the variation of the distance between the adjacent projections is also calculated.

The distance between the adjacent projections means a distance between one projection and another projection closest to the above projection.

More specifically, the distance between the adjacent projections means an inter-apex distance between the adjacent projections. That is, the distance between adjacent projections means a distance between the apex of a projection and the apex of another projection closest to the above projection.

The apex of a projection is the highest point of the projection. Here, for a projection having a planar top portion such as a trapezoidal projection, the projection is observed in the normal direction of the colored film, and the circumcenter of the top surface (surface opposite to the substrate 20) of the polygonal cross-sectional shape of the projection is regarded as an apex.

The standard deviation of the distance between the adjacent projections is 10 to 300 nm, preferably 15 to 300 nm, and more preferably 30 to 300 nm.

Among the projections, 95.0% or more of projections satisfy Formula (1). That is, a proportion of projections satisfying Formula (1) is equal to or higher than 95.0% with respect to the total number of projections.

$$3h/D \geq 1.0 \qquad \text{Formula (1)}$$

h represents a height of the projections, and D represents the average distance between the adjacent projections.

In a case where most of the projections satisfy Formula (1), desired effects are obtained.

The proportion of the projections is calculated by a method of observing the colored film by using a scanning electron microscope, randomly selecting 1,000 or more projections, determining the height of each of the projections, checking whether each of the projections satisfies Formula (1), and calculating a proportion (%) of projections satisfying Formula (1) in the selected projections.

The proportion of the projections satisfying Formula (1) is preferably equal to or higher than 97.0%, and more preferably higher than 99.0%. The upper limit thereof is not particularly limited, but is 100% for example. In many cases, the upper limit is less than 100%.

Although there is no particular limitation, in view of further improving the effects of the present invention, the average of 3h/D is preferably equal to or greater than 1.0, more preferably equal to or greater than 1.3, and even more preferably equal to or greater than 1.5. The upper limit thereof is not particularly limited, but is preferably equal to or smaller than 10.0, and more preferably equal to or smaller than 5.0.

The average of 3h/D is a value obtained by observing the colored film by using a scanning electron microscope, randomly selecting 1,000 or more projections, determining 3h/D for each of the projections, and calculating the arithmetic mean thereof.

Although there is no particular limitation, in view of further improving the effects of the present invention, the average height of the projections is preferably 100 to 3,000 nm, and more preferably 200 to 1,500 nm.

The average height of the projections is a value obtained by observing the colored film by using a scanning electron microscope, randomly selecting 1,000 or more projections, determining the height h of each of the projections, and calculating the arithmetic mean thereof.

The shape of the projections is not particularly limited, and examples thereof include a polygonal prism shape, a pyramidal shape, a conical shape, or an elliptic cone shape. Particularly, in view of further improving the effects of the present invention, each of the projection has a shape tapered toward the tip. Specifically, the pyramidal shape, the conical shape, or the elliptic cone shape is preferable.

In view of further improving the effects of the present invention, it is preferable that the uneven structure has projections which do not satisfy the requirement of Formula (1), and the density of the projections which do not satisfy the requirement of Formula (1) is preferably 0.01 to 10/cm$^2$, more preferably 1 to 10/cm$^2$, and even more preferably 2 to 10/cm$^2$. The density of the projections which do not satisfy the requirement of Formula (1) is calculated by a method of observing the colored film by using a scanning electron microscope, randomly selecting 5 observation surfaces having a size of 1 cm×1 cm, calculating the number of projections which do not satisfy the requirement of Formula (1) in each of the observation surfaces, and calculating the arithmetic mean thereof.

The arrangement pattern of the projections in the uneven structure of the colored film is not particularly limited as long as the above requirements are satisfied. Examples thereof include an aspect in which projections 12a are hexagonally arranged as shown in FIG. 2, an aspect in which projections 12b are arranged in the form of a checkered pattern as shown in FIG. 3, and an aspect in which projections 12c are arranged in the form of an island (island pattern, preferably a square grid pattern) as shown in FIG. 4.

Figure 2:
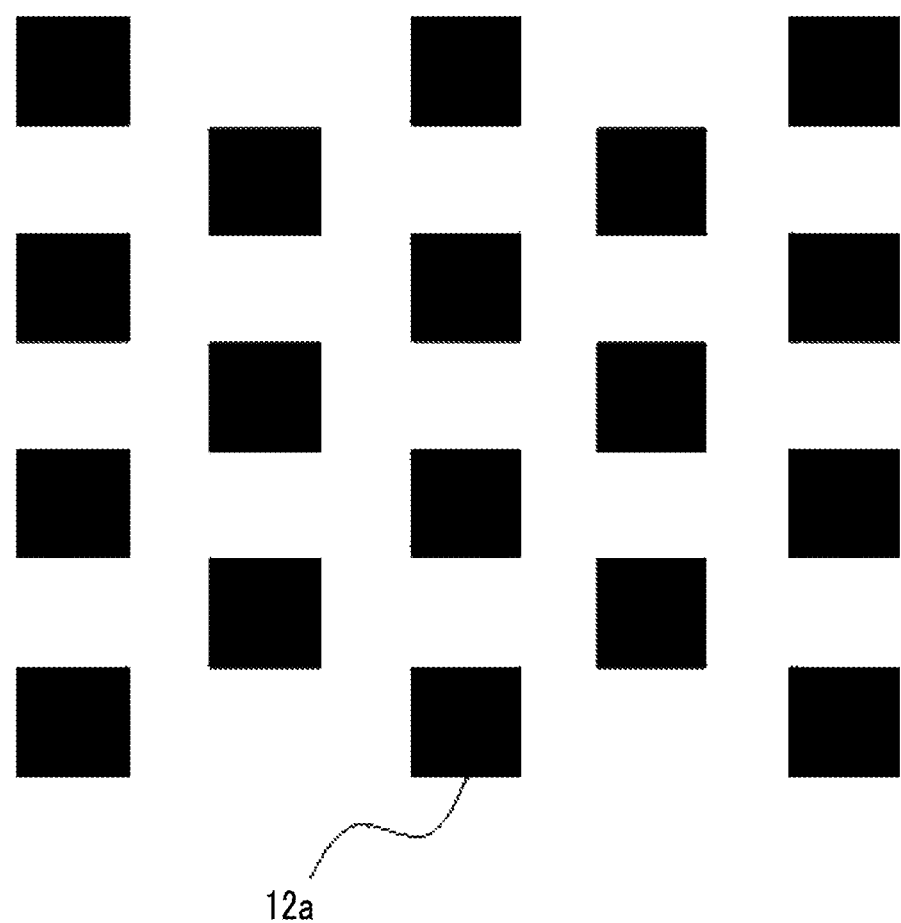
FIG. 2 is a top view of an example of the colored film.
Figure 3:
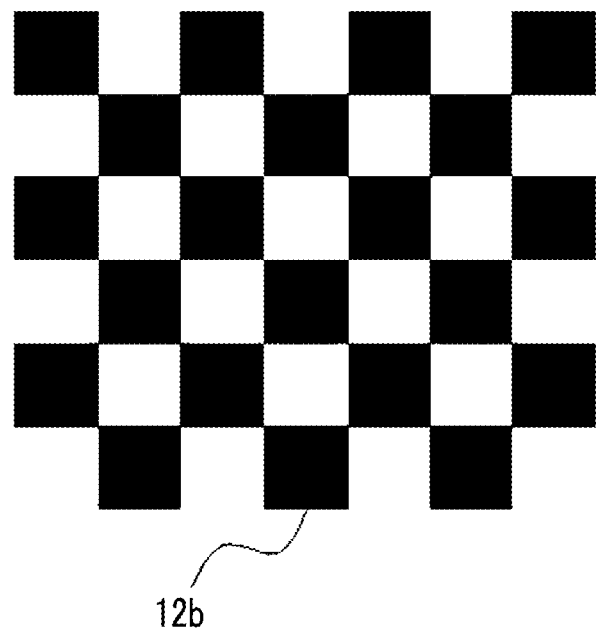
FIG. 3 is a top view of an example of the colored film.
Figure 4:
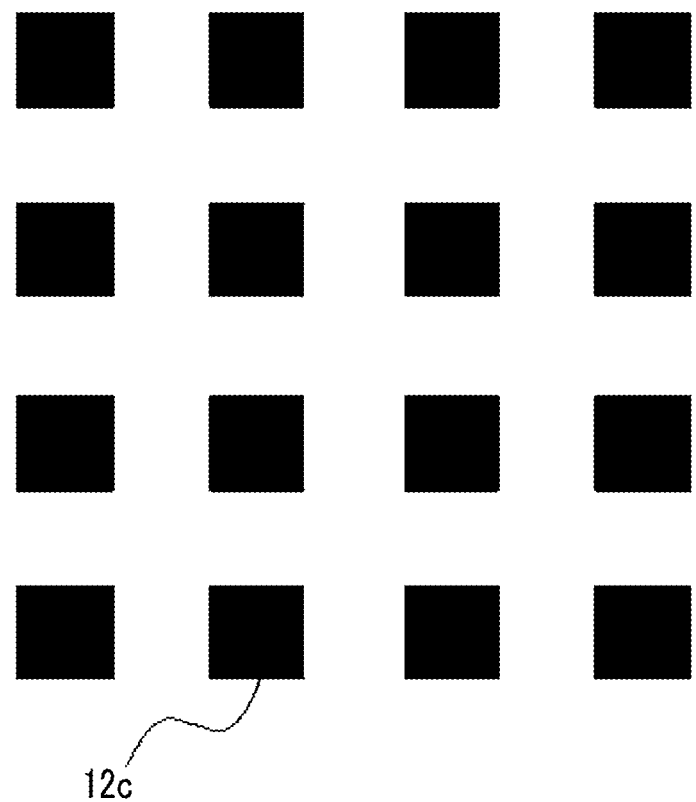
FIG. 4 is a top view of an example of the colored film.

FIGS. 2 to 4 are top views of the colored film, and each of the projections is in the form of a square in all of these drawings. However, the present invention is not limited thereto, and in a case where the projections are observed in the normal direction of the colored film, each of the projections may be in the form of a circle or ellipse.

The average thickness of the colored film is not particularly limited. In view of further improving the effects of the present invention, the average thickness is preferably 0.2 to 3.0 μm, and more preferably 0.6 to 1.5 μm.

As being represented by T in FIG. 1, the thickness of the colored film means a distance between the apex of the projection and a surface of the colored film that is opposite to the surface provided with the uneven structure. The average thickness is determined by measuring the thickness of the colored film at 10 or more random spots and calculating the arithmetic mean thereof.

In view of further improving the effects of the present invention, in the colored film, it is preferable that an optical density per thickness of 1.0 μm is equal to or higher than 0.5 (preferably equal to or higher than 1.0) at a certain wavelength within a wavelength range of 400 to 700 nm. The upper limit thereof is not particularly limited, but is preferably equal to or lower than 10.

Furthermore, in view of further improving the effects of the present invention, at all the wavelengths in the wavelength range of 400 to 700 nm, the optical density per thickness of 1.0 μm is preferably equal to or higher than 0.5, and more preferably equal to or higher than 1.0. The upper limit thereof is not particularly limited, but is preferably equal to or lower than 10.

The manufacturing method of the colored film is not particularly limited, and examples thereof include known methods. Particularly, in view of further improving manufacturing suitability, a method of forming the colored film by a nanoimprinting method or a photolithography method is preferable.

The nanoimprinting method is a method of pressing a mold, in which a predetermined uneven structure is formed, on a film of a composition for forming a colored film, and curing the film of the composition for forming a colored film by light, heat, or the like in a state where the mold is pressed on the film so as to transfer the uneven structure of the mold to the film of the composition for forming a colored film and to manufacture a colored film.

As the method for preparing the uneven structure of the mold, known methods can be adopted.

Furthermore, after the film of the composition for forming a colored film is cured, if necessary, a development treatment may be performed on the colored film.

Examples of the method for forming the film of the composition for forming a colored film include the method described in a step of forming the film of the composition for forming a colored film that will be explained later for the photolithography method.

Examples of the method of the development treatment include the method of the development treatment that will be described later for the photolithography method.

Examples of the photolithography method include a method of forming the film of the composition for forming a colored film on a substrate, performing an exposure treatment on the film of the composition for forming a colored film, and performing a development treatment on the film of the composition for forming a colored film having undergone the exposure treatment.

Hereinafter, the procedure of each step will be specifically described.

(Step of Forming Film of Composition for Forming Colored Film)

A step of forming the film of the composition for forming a colored film is a step of forming the film of the composition for forming a colored film by using the composition for forming a colored film which will be described later. This step is performed, for example, by a method of coating a substrate with the composition for forming a colored film so as to form the film of the composition for forming a colored film.

As will be specifically described later, the composition for forming a colored film used in this step may be any of a so-called positive composition or negative composition. The type of the substrate is not particularly limited. In a case where the colored film is used in a solid-state imaging element, examples of the substrate include a silicon substrate. In a case where the colored film is used as a color filter (including a color filter for a solid-state imaging element), examples of the substrate include a glass substrate (glass wafer).

Examples of the method for coating the substrate with the composition for forming a colored film include a spin coating method, a slit coating method, an ink jet method, a spray coating method, a rotation coating method, a cast coating method, a roll coating method, a screen printing method, and the like.

Generally, the film of the composition for forming a colored film with which the substrate is coated is dried under the condition of 70° C. to 150° C. for about 1 to 4 minutes.

(Exposure Step)

An exposure step is a step of irradiating the formed film of the composition for forming a colored film with actinic rays or radiation through a photomask including pattern-like opening portions. Exposure is preferably performed by radiation irradiation, in which ultraviolet rays such as g-line, h-line, and i-line are preferably used. As a light source, a high-pressure mercury lamp is preferable. The irradiance is not particularly limited, but is preferably 5 to 2,500 mJ/cm$^2$, more preferably 5 to 1,500 mJ/cm$^2$, and even more preferably 10 to 1,000 mJ/cm$^2$ in general.

By changing the type of the mask, the arrangement position of the projections can be adjusted. For example, in a case where the exposure treatment is performed on the film of the composition for forming a colored film by using a mask having hexagonally arranged opening portions, it is possible to manufacture a colored film having hexagonally arranged projections.

(Development Step)

A development step is a step of performing a development treatment on the exposed film of the composition for forming a colored film by using a developer. In a case where the composition for forming a colored film is a negative composition, an exposed portion is cured, and an unexposed portion is removed by the development treatment which will be described later. In a case where the composition for forming a colored film is a positive composition, an exposed portion is removed by the development treatment which will be described later.

The type of the developer is not particularly limited, and examples thereof include an alkali developer and a developer containing an organic solvent.

Although the development condition is not particularly limited, the development temperature is preferably 20° C. to 40° C., and the development time is preferably 20 to 180 seconds.

The alkali developer (aqueous alkali solution) is not particularly limited. Examples of alkaline compounds to be incorporated into an inorganic alkali developer include sodium hydroxide, potassium hydroxide, sodium carbonate, sodium hydrogen carbonate, sodium silicate, sodium metasilicate, and the like.

The content of the above compounds in the aqueous inorganic alkali solution is not particularly limited, but is preferably 0.001% to 10% by mass and more preferably 0.005% to 0.5% by mass with respect to the total mass of the aqueous alkali solution.

Examples of alkaline compounds to be incorporated into an organic alkali developer include ammonia, ethylamine, diethylamine, dimethylethanolamine, tetramethylammonium hydroxide, tetraethylammonium hydroxide, tetrapropylammonium hydroxide, tetrabutylammonium hydroxide, benzyl trimethylammonium hydroxide, choline, pyrrole, piperidine, 1,8-diazabicyclo-[5,4,0]-7-undecene, and the like.

The content of the above compound in the aqueous organic alkali solution is not particularly limited, but is preferably 0.001% to 10% by mass and more preferably 0.005% to 0.5% by mass with respect to the total mass of the aqueous alkali solution.

For example, a water-soluble organic solvent such as methanol or ethanol may be incorporated into the aqueous alkali solution. Furthermore, the aqueous alkali solution may contain a surfactant.

In a case where this type of aqueous alkali solution is used as a developer, it is preferable to rinse the colored film with pure water after the development.

The manufacturing method of the colored film performed by the photolithography method may include other steps. Examples of those other steps include a substrate surface treatment step, a prebaking step, a post-baking step, and the like.

In the prebaking step and the post-baking step, the heating temperature is preferably 80° C. to 300° C. In the prebaking step and the post-baking step, the heating time is preferably 30 to 300 seconds.

Hitherto, as the manufacturing method of the colored film, a nanoimprinting method and a photolithography method have been described. However, the colored film may be manufactured by other methods. For example, the colored film having a predetermined uneven structure can also be formed by forming a solid film of a composition for forming a colored film which will be described later and performing an etching treatment on the solid film through a predetermined mask.

<Composition for Forming Colored Film>

(Colorant)

Generally, the composition for forming a colored film contains a colorant.

The colorant is at least one kind of substance selected from the group consisting of a pigment and a dye.

The content of the colorant with respect to the total solid content of the composition for forming a colored film is preferably equal to or greater than 30% by mass, and more preferably equal to or greater than 40% by mass. The upper limit thereof is not particularly limited, but is preferably equal to or smaller than 80% by mass with respect to the total solid content of the composition for forming a colored film.

(Pigment)

The type of the pigment is not particularly limited, and examples thereof include known inorganic pigments and/or organic pigments.

The type of the inorganic pigments is not particularly limited, and examples thereof include known inorganic pigments.

Examples of the inorganic pigments include zinc oxide, white lead, lithopone, titanium oxide, chromium oxide, iron oxide, precipitated barium sulfate, barite powder, red lead, red iron oxide, chromium yellow, zinc chromium (one kind of zinc chromium or two kinds of zinc chromium), ultramarine blue, Prussian blue (potassium ferric ferrocyanide), zircon grey, Praseodymium yellow, chromium titanium yellow, chromium green, peacock, Victoria green, iron blue (irrelevant to Prussian blue), vanadium zirconium blue, chromium tin pink, manganese pink, salmon pink, and the like. Examples of black inorganic pigments include a metal oxide, a metal nitride, a metal oxynitride, and the like containing at least one kind of metallic element selected from the group consisting of Co, Cr, Cu, Mn, Ru, Fe, Ni, Sn, Ti, and Ag.

As the inorganic pigments, carbon black, titanium black, a metallic pigment, and the like (hereinafter, these will be collectively referred to as "black pigment" as well) are preferable because these pigments make it possible to obtain the composition for forming a colored film that can form a colored film having a high optical density even though the content of the pigments is small. Examples of the metallic pigment include a metal oxide, a metal nitride, a metal oxynitride, and the like containing at least one kind of metallic element selected from the group consisting of Nb, V, Co, Cr, Cu, Mn, Ru, Fe, Ni, Sn, Ti, and Ag.

The inorganic pigment is preferably at least one kind of pigment selected from the group consisting of a metallic pigment containing titanium nitride, titanium oxynitride, niobium nitride, vanadium nitride, and silver, a metallic pigment containing silver, and a metallic pigment containing silver and tin, and more preferably at least one kind of pigment selected from the group consisting of titanium nitride, titanium oxynitride, niobium nitride, and vanadium nitride. The niobium nitride and the vanadium nitride described above may also be niobium oxynitride and vanadium oxynitride.

Specific examples of carbon black include C. I. Pigment Black 7 or the like which is a commercial product.

The composition for forming a colored film may contain an infrared-absorbing pigment in addition to the pigments described above.

As the infrared-absorbing pigment, a tungsten compound or a metal boride is preferable. Among these, a tungsten compound is more preferable because this compound exhibits excellent light blocking properties at a wavelength in an infrared range.

Two or more kinds of the aforementioned pigments may be used in combination, and the aforementioned pigments may be used in combination with dyes which will be described later. In order to adjust tint and to improve the light blocking properties in a desired wavelength range, for example, it is possible to adopt an aspect in which the black pigment or the infrared-blocking pigment is mixed with a chromatic pigment of red, green, yellow, orange, purple, blue, or the like or mixed with the dyes which will be described later. The black pigment or the infrared-blocking pigment is preferably mixed with a red pigment or a red dye or with a purple pigment or a purple dye, and more preferably mixed with a red pigment.

Furthermore, a near-infrared absorber or an infrared absorber which will be described later may be added to the composition for forming a colored film.

As the black pigment, titanium black or niobium oxynitride is preferable. Titanium black is black particles containing titanium atoms. Particularly, lower titanium oxide, titanium oxynitride, or titanium nitride is preferable. According to the purpose such as improvement of dispersibility or reduction of aggregating properties, the surface of titanium black can be modified. Specifically, titanium black may be coated with silicon oxide, titanium oxide, germanium oxide, aluminum oxide, magnesium oxide, or zirconium oxide. Furthermore, titanium black may be treated with a water-repellent substance as described in JP2007-302836A.

Typically, titanium black is titanium black particles, and it is preferable that both the primary particle diameter of each of the particles and average primary particle diameter are small. The same is true for niobium oxynitride.

Specifically, the average primary particle diameter is preferably within a range of 10 to 45 nm.

The average primary particle diameter of a pigment can be measured using a Transmission Electron Microscope (TEM). Examples of the transmission electron microscope include a transmission electron microscope HT7700 manufactured by Hitachi High-Technologies Corporation.

In the present specification, in order to determine the average primary particle diameter of a pigment, for a particle image obtained using a transmission electron microscope, a maximum length (Dmax: maximum length between two points on the contour of the particle image) and a vertical length to maximum length (Dv-max: in a case where the image is interposed between two straight lines parallel to the line of the maximum length, DV-max is a minimum length of a line vertically connecting the two straight lines) are measured, and the value of geometrical mean thereof (Dmax×DV-max)½ is adopted as a particle diameter. By this method, particle diameters are measured for 100 particles. The average primary particle diameter means the arithmetic mean thereof.

The specific surface area of titanium black and niobium oxynitride is not particularly limited. In order to obtain predetermined water repellency after treating the surface of titanium black and niobium oxynitride with a water-repellent agent, the specific surface area measured by the Brunauer, Emmett, Teller (BET) method is preferably 5 to 150 $m^2/g$, and more preferably 20 to 120 $m^2/g$.

Examples of commercial products of titanium black include TITANIUM BLACK 10S, 12S, 13R, 13M, 13M-C, 13R-N, and 13M-T (trade names, manufactured by Mitsubishi Materials Corporation), Tilack D (trade name, manufactured by AKO KASEI CO., LTD.), TITANIUM NITRIDE 50 nm (trade name, manufactured by Wako Pure Chemical Industries, Ltd.), and the like.

It is also preferable that the composition for forming a colored film may contain titanium black as a substance to be dispersed containing titanium black and Si atoms.

In this aspect, titanium black is incorporated into the composition for forming a colored film as a substance to be dispersed, and a content ratio between Si atoms and Ti atoms (Si/Ti) in the substance to be dispersed that is expressed in terms of mass is preferably equal to or higher than 0.05, more preferably 0.05 to 0.5, and even more preferably 0.07 to 0.4.

The substance to be dispersed includes both the titanium black in the form of primary particles and titanium black in the form of aggregates (secondary particles).

In order to change Si/Ti in the substance to be dispersed (for example, in order to set Si/Ti to be equal to or higher than 0.05), the following means can be used.

First, a dispersion is obtained by dispersing titanium oxide and silica particles by using a disperser. The dispersion is subjected to a reduction treatment at a high temperature (for example, 850° C. to 1,000° C.). In this way, it is possible to obtain a substance to be dispersed which contains titanium black particles as a main component, Si, and Ti. The reduction treatment can also be performed in an atmosphere of a reducing gas such as ammonia.

Examples of titanium black include TTO-51N (trade name, manufactured by ISHIHARA SANGYO KAISHA, LTD.), and the like.

Examples of commercial products of silica particles include AEROSIL (registered trademark) 90, 130, 150, 200, 255, 300, and 380 (trade names, manufactured by Evonik Industries), and the like.

The titanium oxide and the silica particles may be dispersed using a dispersant. Examples of the dispersant include those described in the section of dispersant which will be described later.

The titanium oxide and the silica particles may be dispersed in a solvent. Examples of the solvent include water and an organic solvent. Examples of the organic solvent include those described in the section of organic solvent which will be described later.

Titanium black in which Si/Ti is adjusted can be prepared, for example, by the method described in paragraph "0005" and paragraphs "0016" to "0021" in JP2008-266045A.

As the titanium black in the substance to be dispersed containing titanium black and Si atoms, those described above can be used.

Furthermore, for the purpose of adjusting dispersibility, colorability, and the like, in the substance to be dispersed, one kind of black pigment or two or more kinds of black pigments selected from a composite oxide of Cu, Fe, Mn, V, Ni, and the like, cobalt oxide, iron oxide, carbon black, aniline black, and the like may be used in combination with titanium black.

In this case, in the entirety of the substance to be dispersed, the proportion of a substance to be dispersed formed of titanium black is preferably equal to or higher than 50% by mass.

In the substance to be dispersed, for the purpose of adjusting light blocking properties and the like, as long as the effects of the present invention are not impaired, other colorants (an organic pigment and/or a dye, and the like) may be used in combination with titanium black as necessary.

Hereinafter, the materials used at the time of introducing Si atoms into the substance to be dispersed will be described. At the time of introducing Si atoms into the substance to be dispersed, a Si-containing substance such as silica may be used.

Examples of usable silica include precipitated silica, fumed silica, colloidal silica, synthetic silica, and the like.

In a case where the particle diameter of silica particles is smaller than the film thickness of the formed colored film, the light blocking properties are further improved. Accordingly, it is preferable to use fine particle-type silica as the silica particles. Examples of the fine particle-type silica include silica described in paragraph "0039" in JP2013-249417A, and the content of the paragraph is incorporated into the present specification.

As a pigment, a tungsten compound and a metal boride can also be used.

Hereinafter, the tungsten compound and the metal boride will be specifically described.

The tungsten compound and the metal boride are infrared screening materials which exhibit high absorptivity with respect to infrared rays (light having a wavelength of about 800 to 1,200 nm) (that is, materials which exhibit high light blocking properties (light screening properties) with respect to infrared rays) but exhibit low absorptivity with respect to visible light. Therefore, in a case where the composition for forming a colored film contains the tungsten compound and/or the metal boride, it is possible to form a colored film which exhibits high light blocking properties in an infrared range and high transmitting properties in a visible range.

The tungsten compound and the metal boride also exhibit low absorptivity with respect to a high-pressure mercury lamp, KrF, ArF, or the like which is light used for exposure at the time of forming an image and has a wavelength shorter than the visible range.

Examples of the tungsten compound include a tungsten oxide-based compound, a tungsten boride-based compound, a tungsten sulfide-based compound, and the like. As the tungsten compound, a tungsten oxide-based compound represented by Formula (compositional formula) (I) is preferable.

$$M_xW_yO_z \qquad (I)$$

In the formula, M represents a metal, W represents tungsten, and O represents oxygen. x, y, and z satisfy $0.001 \leq x/y \leq 1.1$ and $2.2 \leq z/y \leq 3.0$.

Examples of the metal represented by M include an alkali metal, an alkaline earth metal, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, Bi, and the like. Among these, an alkali metal is preferable. The tungsten oxide-based compound may contain one kind of metal represented by M or two or more kinds of metals represented by M.

M is preferably an alkali metal, more preferably Rb or Cs, and even more preferably Cs.

In a case where x/y is equal to or higher than 0.001, infrared rays can be sufficiently screened out. In a case where x/y is equal to or lower than 1.1, it is possible to more reliably prevent the generation of an impurity phase in the tungsten compound.

In a case where z/y is equal to or higher than 2.2, it is possible to further improve the chemical stability of the tungsten oxide-based compound as a material. In a case where z/y is equal to or lower than 3.0, infrared rays can be sufficiently screened out.

Specific examples of the tungsten oxide-based compound represented by Formula (I) include $Cs_{0.33}WO_3$, $Rb_{0.33}WO_3$, $K_{0.33}WO_3$, $Ba_{0.33}WO_3$, and the like. Among these, $Cs_{0.33}WO_3$ or $Rb_{0.33}WO_3$ is preferable, and $Cs_{0.33}WO_3$ is more preferable.

The tungsten compound is preferably fine particles. The average primary particle diameter of the tungsten fine particles is preferably equal to or smaller than 800 nm, more preferably equal to or smaller than 400 nm, and even more preferably equal to or smaller than 200 nm. In a case where the average primary particle diameter is within the above range, it is difficult for the tungsten fine particles to screen out visible light due to light scattering, and accordingly, the transmitting properties thereof in a visible range can be further improved. From the viewpoint of preventing light scattering, the smaller the average primary particle diameter, the better. However, for the reason of ease of handling at the time of manufacturing and the like, the average primary particle diameter of the tungsten fine particles is equal to or greater than 1 nm in general.

Furthermore, two or more kinds of tungsten compounds can be used.

Although the tungsten compound is available as a commercial product, the tungsten oxide-based compound can be obtained, for example, by a method of performing a heat treatment on the tungsten compound in an inert gas atmosphere or in a reducing gas atmosphere (see Japanese Patent No. 4096205).

Furthermore, the tungsten oxide-based compound is also available, for example, as a dispersion of tungsten fine particles such as YMF-02 manufactured by SUMITOMO METAL MINING CO., LTD.

Examples of the metal boride include one kind of compound or two or more kinds of compounds such as lanthanum boride ($LaB_6$), praseodymium boride ($PrB_6$), neodymium boride ($NdB_6$), cerium boride ($CeB_6$), yttrium boride ($YB_6$), titanium boride ($TiB_2$), zirconium boride ($ZrB_2$), hafnium boride ($HfB_2$), vanadium boride ($VB_2$), tantalum boride ($TaB_2$), chromium boride ($CrB$, $CrB_2$), molybdenum boride ($MoB_2$, $Mo_2B_5$, $MoB$), and tungsten boride ($W_2B_5$). Among these, lanthanum boride ($LaB_6$) is preferable.

The metal boride is preferably fine particles. The average primary particle diameter of the metal boride fine particles is preferably equal to or smaller than 800 nm, more preferably equal to or smaller than 300 nm, and even more preferably equal to or smaller than 100 nm. In a case where the average primary particle diameter is within the above range, it is difficult for the metal boride fine particles to screen out visible light due to light scattering, and accordingly, the transmitting properties thereof in a visible range can be further improved. From the viewpoint of preventing light scattering, the smaller the average primary particle diameter, the better. However, for the reason of ease of handling at the time of manufacturing and the like, the average primary particle diameter of the metal boride fine particles is equal to or greater than 1 nm in general.

Furthermore, two or more kinds of metal borides can be used.

The metal boride is available as a commercial product. For example, the metal boride is available as a dispersion of metal boride fine particles such as KHF-7 manufactured by SUMITOMO METAL MINING CO., LTD.

As the inorganic pigment, titanium nitride-containing particles containing Fe atoms can also be used. For manufacturing the titanium nitride-containing particles, generally, a gas-phase reaction method is used. Specifically, examples of the gas-phase reaction method include an electric furnace method, a thermal plasma method, and the like. Among these manufacturing methods, a thermal plasma method is preferable because this method reduces the amount of impurities mixed in, makes it easy to obtain a uniform particle diameter, and has high productivity.

Examples of the method for generating thermal plasma include direct current arc discharge, multiphase arc discharge, radio frequency (RF) plasma, hybrid plasma, and the like. Among these, radio frequency plasma is preferable because this reduces the amount of impurities mixed in from an electrode. Examples of the specific manufacturing method of the titanium nitride-containing particles by using the thermal plasma method include a method of evaporating titanium powder by using radio frequency thermal plasma, introducing nitrogen into a device as a carrier gas, and nitriding the titanium powder by a cooling process so as to synthesize the titanium nitride-containing particles. The thermal plasma method is not limited to the above.

The manufacturing method of the titanium nitride-containing particles is not particularly limited, and the manufacturing method described in paragraphs "0037" to "0089" in WO2010/147098A can be referred to. For example, by using an Fe-containing component and/or a Si-containing component, which will be described later, instead of Ag powder described in WO2010/147098A, mixing the aforementioned component with a titanium powder material (titanium particles), and using the obtained mixture as a raw material, it is possible to manufacture titanium nitride-containing particles to be incorporated into the composition for forming a colored film.

The method for incorporating Fe atoms into the titanium nitride-containing particles is not particularly limited. Examples thereof include a method of introducing Fe atoms into the particles at the stage of obtaining titanium particles used as a raw material of the titanium nitride-containing particles. More specifically, in a case where a reaction container constituted with an Fe atom-containing material such as stainless steel is used at the time of manufacturing titanium by the Kroll process, or in a case where an Fe atom-containing material is used as a material of a press machine and a grinder at the time of crushing titanium, it is possible to attach Fe atoms to the surface of titanium particles.

In a case where the thermal plasma method is used for manufacturing the titanium nitride-containing particles, by adding components such as Fe particles and an Fe oxide in addition to the titanium particles as a raw material, and nitriding these components by the thermal plasma method, it is possible to incorporate Fe atoms into the titanium nitride-containing particles.

Fe atoms to be incorporated into the titanium nitride-containing particles may be incorporated into the particles in any forms such as ions, a metal compound (including a complex compound), an intermetallic compound, an alloy, an oxide, a composite oxide, a nitride, an oxynitride, a sulfide, an oxysulfide, and the like. The Fe atoms to be incorporated into the titanium nitride-containing particles may be present as an impurity positioned between crystal lattices or present as an amorphous impurity in the crystal grain boundary.

The content of Fe atoms in the titanium nitride-containing particles with respect to the total mass of the titanium nitride-containing particles is preferably greater than 0.001% by mass and less than 0.4% by mass, more preferably 0.01% to 0.2% by mass, and even more preferably 0.02% to 0.1% by mass. The content of Fe atoms in the titanium nitride-containing particles is measured by Inductively Coupled Plasma (ICP) emission spectrometry.

It is preferable that the titanium nitride-containing particles further contain Si atoms. In a case where the particles contain Si atoms (silicon atoms), the patterning properties of the colored film are further improved.

The content of Si atoms in the titanium nitride-containing particles with respect to the total mass of the titanium nitride-containing particles is preferably greater than 0.002% by mass and less than 0.3% by mass, more preferably 0.01% to 0.15% by mass, and even more preferably 0.02% to 0.1% by mass. The content of Si atoms in the titanium nitride-containing particles is measured by the same method as that used for Fe atoms.

The method for incorporating Si atoms into the titanium nitride-containing particles is not particularly limited, and examples thereof include a method of introducing Si atoms into the titanium nitride-containing particles at the stage of obtaining titanium particles used as a raw material of the titanium nitride-containing particles. More specifically, in a case where a reaction container constituted with a Si atom-containing material is used at the time of manufacturing titanium by the Kroll process, or in a case where a Si atom-containing material is used as a material of a press machine and a grinder at the time of crushing titanium, it is possible to attach Si atoms to the surface of titanium particles.

In a case where the thermal plasma method is used for manufacturing the titanium nitride-containing particles, by adding components such as Si particles and a Si oxide in addition to the titanium particles as a raw material, and nitriding these components by the thermal plasma method, it is possible to incorporate Si atoms into the titanium nitride-containing particles.

Si atoms to be incorporated into the titanium nitride-containing particles may be incorporated into the particles in any forms such as ions, a metal compound (including a complex compound), an intermetallic compound, an alloy, an oxide, a composite oxide, a nitride, an oxynitride, a sulfide, an oxysulfide, and the like. The Si atoms to be incorporated into the titanium nitride-containing particles may be present as an impurity positioned between crystal lattices or present as an amorphous impurity in the crystal grain boundary.

The content of titanium atoms (Ti atoms) in the titanium nitride-containing particles with respect to the total mass of the titanium nitride-containing particles is preferably 10% to 85% by mass, more preferably 15% to 75% by mass, and even more preferably 20% to 70% by mass. The content of Ti atoms in the titanium nitride-containing particles can be analyzed by ICP emission spectrometry.

The content of nitrogen atoms (N atoms) in the titanium nitride-containing particles with respect to the total mass of the titanium nitride-containing particles is preferably 3% to 60% by mass, more preferably 5% to 50% by mass, and even more preferably 10% to 40% by mass. The content of nitrogen atoms can be analyzed by an inert gas fusion-thermal conductivity method.

The titanium nitride-containing particles contain titanium nitride (TiN) as a main component. Some of the titanium nitride-containing particles may contain oxygen atoms resulting from the oxidation of the particle surface, although the oxygen atoms become noticeable in a case where oxygen is mixed into the particles at the time of synthesizing the particles, in a case where the particle diameter is small, and the like, in general.

The content of oxygen atoms in the titanium nitride-containing particles with respect to the total mass of the titanium nitride-containing particles is preferably 1% to 40% by mass, more preferably 1% to 35% by mass, and even more preferably 5% to 30% by mass. The content of oxygen atoms can be analyzed by an inert gas fusion-infrared absorption method.

From the viewpoint of dispersion stability and light blocking properties, the specific surface area of the titanium nitride-containing particles is preferably 5 to 100 $m^2/g$, and more preferably 10 to 60 $m^2/g$. The specific surface area can be determined by the Brunauer, Emmett, Teller (BET) method.

The titanium nitride-containing particles may be composite fine particles formed of titanium nitride particles and fine metal particles.

The composite fine particles refer to particles in which titanium nitride particles and fine metal particles are combined or in a highly dispersed state. Herein, "combined" means that the particles are constituted with two components consisting of titanium nitride and a metal, and "highly dispersed state" means that titanium nitride particles and metal particles are present as independent particles, and that particles in smaller amounts are homogeneously and uniformly dispersed without being aggregated.

The fine metal particles are not particularly limited, and examples thereof include at least one kind of metal selected from copper, silver, gold, platinum, palladium, nickel, tin, cobalt, rhodium, iridium, ruthenium, osmium, manganese, molybdenum, tungsten, niobium, tantalum, calcium, titanium, bismuth, antimony, lead, and an alloy of these. Among these, at least one kind of metal selected from copper, silver, gold, platinum, palladium, nickel, tin, cobalt, rhodium, iridium, and an alloy of these is preferable, and at least one kind of metal selected from copper, silver, gold, platinum, tin, and an alloy of these is more preferable. The fine metal particles are preferably silver because this metal has better moist resistance. The content of the fine metal particles in the titanium nitride-containing particles with respect to the total mass of the titanium nitride-containing particles is preferably 5% to 50% by mass, and more preferably 10% to 30% by mass.

Examples of the organic pigments include Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like, C. I. Pigment Orange 2, 5, 13, 16, 17:1, 31, 34, 36, 38, 43, 46, 48, 49, 51, 52, 55, 59, 60, 61, 62, 64, 71, 73, and the like, C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like, C. I. Pigment Green 7, 10, 36, 37, 58, 59, and the like, C. I. Pigment Violet 1, 19, 23, 27, 32, 37, 42, and the like, C. I. Pigment Blue 1, 2, 15, 15:1, 15:2, 15:3, 15:4, 15:6, 16, 22, 60, 64, 66, 79, 80, and the like. One kind of organic pigment may be used singly, or two or more kinds of organic pigments may be used in combination.

(Dye) As a dye, for example, it is possible to use the dyes disclosed in JP1989-090403A (JP-S64-090403A), JP1989-091102A (JP-S64-091102A), JP1989-094301A (JP-H01-094301A), JP1994-011614A (JP-H06-011614A), JP2592207B, US4808501A, US5667920A, US0505950A, JP1993-333207A (JP-H05-333207A), JP1994-035183A (JP-H06-035183A), JP1994-051115A (JP-H06-051115A), JP1994-194828A (JP-H06-194828A), and the like. In a case where the dyes are sorted based on the chemical structure thereof, examples thereof include a pyrazole azo compound, a pyrromethene compound, an anilinoazo compound, a triphenylmethane compound, an anthraquinone compound, a benzylidene compound, an oxonol compound, a pyrazolotriazole azo compound, a pyridone azo compound, a cyanine compound, a phenothiazine compound, a pyrrolopyrazole azomethine compound, and the like. Furthermore, as the dye, a coloring agent multimer may also be used. Examples of the coloring agent multimer include the compounds described in JP2011-213925A and JP2013-041097A. In addition, a polymerizable dye having a polymerizable group in a molecule may be used, and examples thereof include commercial products such as an RDW series manufactured by Wako Pure Chemical Industries, Ltd.

(Polymerizable Compound)

The composition for forming a colored film may also contain a polymerizable compound. Particularly, in a case where the composition for forming a colored film is a negative composition, it is preferable that the composition for forming a colored film contains a polymerizable compound. Furthermore, at the time of performing the nanoimprinting method, it is preferable that the composition for forming a colored film contains a polymerizable compound.

In the present specification, a polymerizable compound means a compound having a polymerizable group that is different from resins (a dispersant and an alkali-soluble resin) which will be described later.

The content of the polymerizable compound in the composition for forming a colored film is not particularly limited, but is preferably 5% to 50% by mass with respect to the total solid content of the composition for forming a colored film in general. One kind of polymerizable compound may be used singly, or two or more kinds of polymerizable compounds may be used in combination. In a case where two or more kinds of polymerizable compounds are used in combination, the total content thereof is preferably within the above range.

The polymerizable compound preferably contains one or more groups containing an ethylenically unsaturated bond, more preferably contains two or more groups containing an ethylenically unsaturated bond, even more preferably contains three or more groups containing an ethylenically unsaturated bond, and particularly preferably contains five or more groups containing an ethylenically unsaturated bond. The upper limit of the number of groups described above is equal to or smaller than 15, for example. Examples of the group containing an ethylenically unsaturated bond include a vinyl group, a (meth)acryl group, a (meth)acryloyl group, and the like.

As the polymerizable compound, for example, the compounds described in paragraph "0050" in JP2008-260927A and paragraph "0040" in JP2015-068893A can be used, and the contents of these paragraphs are incorporated into the present specification.

The polymerizable compound may be in any chemical form such as a monomer, a prepolymer, an oligomer, a mixture of these, or a multimer of these.

The polymerizable compound is preferably a (meth)acrylate compound having 3 to 15 functional groups, and more preferably a (meth)acrylate compound having 5 to 15 functional groups.

As the polymerizable compound, a compound is preferable which contains one or more groups containing an ethylenically unsaturated bond and has a boiling point equal to or higher than 100° C. under normal pressure. For example, the compounds described in paragraph "0227" in JP2013-029760A and paragraphs "0254" to "0257" in JP2008-292970A can be used, and the contents of these paragraphs are incorporated into the present specification.

As the polymerizable compound, dipentaerythritol triacrylate (as a commercial product, KAYARAD D-330; manufactured by Nippon Kayaku Co., Ltd.), dipentaerythritol tetraacrylate (as a commercial product, KAYARAD D-320; manufactured by Nippon Kayaku Co., Ltd.), dipentaerythritol penta(meth)acrylate (as a commercial product, KAYARAD D-310; manufactured by Nippon Kayaku Co., Ltd.), dipentaerythritol hexa(meth)acrylate (as a commercial product, KAYARAD DPHA, mixture with dipentaerythritol penta(meth)acrylate, manufactured by Nippon Kayaku Co., Ltd.); A-DPH-12E (manufactured by SHIN-NAKAMURA CHEMICAL CO., LTD.), and a structure in which an ethylene glycol residue or a propylene glycol residue is between these (meth)acryloyl groups (for example, SR454 and SR499 marketed by Sartomer) are preferable. Oligomer types of these can also be used. Examples of the polymerizable compound also include NK ESTER A-TMMT (pentaerythritol tetraacrylate, manufactured by SHIN-NAKAMURA CHEMICAL CO., LTD.), KAYARAD RP-1040 (manufactured by Nippon Kayaku Co., Ltd.), and the like.

The polymerizable compound may have an acid group such as a carboxylic acid group, a sulfonic acid group, or a phosphoric acid group. As the polymerizable compound containing an acid group, an ester of an aliphatic polyhydroxy compound and unsaturated carboxylic acid is preferable, and a polymerizable compound is more preferable which is obtained by reacting a nonaromatic carboxylic acid anhydride with an unreacted hydroxyl group of an aliphatic polyhydroxy compound such that an acid group is incorporated into the compound. As the polymerizable compound containing an acid group, the aforementioned esters in which the aliphatic polyhydroxy compound is pentaerythritol and/or dipentaerythritol are even more preferable.

Examples of commercial products of the polymerizable compound include ARONIX TO-2349, M-305, M-510, and M-520 manufactured by TOAGOSEI CO., LTD., and the like.

The acid value of the polymerizable compound containing an acid group is preferably 0.1 to 40 mgKOH/g, and more preferably 5 to 30 mgKOH/g. In a case where the acid value of the polymerizable compound is equal to or greater than 0.1 mgKOH/g, the composition for forming a colored film has further improved developability (characteristics by which the composition is more easily dissolved in an alkali developer). In a case where the acid value of the polymerizable compound is equal to or smaller than 40 mgKOH/g, there is an advantage in manufacturing and/or handling the polymerizable compound, and the composition for forming a colored film has further improved photopolymerization properties.

As the polymerizable compound, a compound containing a caprolactone structure is preferable.

The compound containing a caprolactone structure is not particularly limited as long as the compound has a caprolactone structure in a molecule. Examples thereof include known compounds.

Examples of the compound containing a caprolactone structure include ε-caprolactone-modified polyfunctional (meth)acrylate which is obtained by esterifying a polyhydric alcohol such as trimethylolethane, ditrimethylolethane, trimethylolpropane, ditrimethylolpropane, pentaerythritol, dipentaerythritol, tripentaerythritol, glycerin, diglycerol, or trimethylol melamine, (meth)acrylic acid, and ε-caprolactone.

Furthermore, the polymerizable compound may also contain a cardo-skeleton.

As the polymerizable compound containing a cardo-skeleton, a polymerizable compound containing a 9,9-bisarylfluorene skeleton is preferable.

The polymerizable compound containing a cardo-skeleton is not particularly limited, and examples thereof include an ONCOAT EX series (manufactured by NAGASE & CO., LTD.), OGSOL (manufactured by Osaka Gas Chemicals Co., Ltd.), and the like.

(Polymerization Initiator)

The composition for forming a colored film may also contain a polymerization initiator.

The type of the polymerization initiator is not particularly limited, and examples thereof include known polymerization initiators. Examples of the polymerization initiator include a photopolymerization initiator, a thermal polymerization initiator, and the like. Among these, a photopolymerization initiator is preferable. It is also preferable that the polymerization initiator is selected from a polymerization initiator without colorability and a polymerization initiator having high fading properties. As the polymerization initiator, a so-called radical polymerization initiator is preferable.

The content of the polymerization initiator in composition for forming a colored film is not particularly limited, but is preferably 0.5% to 20% by mass with respect to the total solid content of the composition for forming a colored film. One kind of polymerization initiator may be used singly, or two or more kinds of polymerization initiators may be used in combination. In a case where two or more kinds of polymerization initiators are used in combination, the total content thereof is preferably within the above range.

Examples of thermal polymerization initiators include an azo compound such as 2,2'-azobisisobutyronitrile (AIBN), 3-carboxypropionitrile, azobismalenonitrile, or dimethyl-(2, 2')-azobis(2-methylpropionate) [V-601] and an organic peroxide such as benzoyl peroxide, lauroyl peroxide, or potassium persulfate.

Examples of the thermal polymerization initiator include the compounds described in Kiyomi Kato, "Ultraviolet Curing System", SOGO GIJUTSU CENTER, 1989, pp. 65-148, and the like.

It is preferable that the composition for forming a colored film contains a photopolymerization initiator.

As the photopolymerization initiator, known photopolymerization initiators can be used without particular limitation as long as they can initiate the polymerization of a polymerizable compound. As the photopolymerization initiator, for example, a compound exhibiting photosensitivity in a range of ultraviolet rays to visible rays is preferable. Furthermore, the photopolymerization initiator may be an activator which generates active radicals by interacting in a certain way with a photoexcited sensitizer or an initiator which initiates cationic polymerization according to the type of the polymerizable compound.

Furthermore, it is preferable that the composition for forming a colored film contains, as a photopolymerization initiator, at least one kind of compound having at least a molar absorption coefficient which is approximately 50 in a range of about 300 to 800 nm (more preferably 330 to 500 nm).

The content of the photopolymerization initiator in the composition for forming a colored film is not particularly limited, but is preferably 0.1% to 20% by mass with respect to the total solid content of the composition for forming a colored film. One kind of photopolymerization initiator may be used singly, or two or more kinds of photopolymerization initiators may be used in combination. In a case where two or more kinds of photopolymerization initiators are used in combination, the total content thereof is preferably within the above range.

Examples of the photopolymerization initiator include a halogenated hydrocarbon derivative (for example, a halogenated hydrocarbon derivative containing a triazine skeleton, a halogenated hydrocarbon derivative containing an oxadiazole skeleton, or the like), an acyl phosphine compound such as acyl phosphine oxide, hexaaryl biimidazole, an oxime compound such as an oxime derivative, an organic peroxide, a thio compound, a ketone compound, an aromatic onium salt, an aminoacetophenone compound, hydroxyacetophenone, and the like.

Regarding the photopolymerization initiator, for example, paragraphs "0265" to "0268" in JP2013-029760A can be referred to, and the contents of the paragraphs are incorporated into the present specification.

As the photopolymerization initiator, for example, the aminoacetophenone-based initiator described in JP1998-291969A (JP-H10-291969A) and the acyl phosphine-based initiator described in JP4225898B can be used. The contents of the above documents are incorporated into the present specification.

Examples of the hydroxyacetophenone compound include IRGACURE-184, DAROCUR-1173, IRGACURE-500, IRGACURE-2959, and IRGACURE-127 (trade names, manufactured by BASF SE), and the like.

Examples of the aminoacetophenone compound include commercial products such as IRGACURE-907, IRGACURE-369, and IRGACURE-379EG (trade names, manufactured by BASF SE). As the aminoacetophenone compound, it is also possible to use the compound described in JP2009-191179A whose absorption wavelength is matched with a light source of a long wavelength such as 365 nm, 405 nm, or the like. The content of the above document is incorporated into the present specification.

Examples of the acyl phosphine compound include IRGACURE-819 and IRGACURE-TPO (trade names, manufactured by BASF SE), and the like.

As the photopolymerization initiator, an oxime ester-based polymerization initiator (oxime ester compound, hereinafter, referred to as "oxime compound" as well) is preferable. The oxime compound has higher sensitivity and higher polymerization efficiency. Consequently, even in a case where the composition for forming a colored film containing the oxime compound contains a large amount of pigments, the composition has better curing properties.

As the oxime compound, it is possible to use the compound described in JP2001-233842A, the compound described in JP2000-080068A, and the compound described in JP2006-342166A. The contents of the above documents are incorporated into the present specification.

Examples of the oxime compound include 3-benzoyloxyiminobutan-2-one, 3-aceotxyiminobutan-2-one, 3-propionyloxyiminobutane-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, 2-ethoxycarbonyloxyimino-1-phenylpropan-1-one, and the like.

Examples of the oxime compound also include the compounds described in J. C. S. Perkin II (1979) pp. 1653-1660, J. C. S. Perkin II (1979) pp. 156-162, Journal of Photopolymer Science and Technology (1995) pp. 202-232, JP2000-066385A, JP2000-080068A, JP2004-534797A, and JP2006-342166A, and the like. The contents of the above documents are incorporated into the present specification.

Examples of commercial products of the oxime compound include IRGACURE-OXE01 (manufactured by BASF SE), IRGACURE-OXE02 (manufactured by BASF SE), IRGACURE-OXE03 (manufactured by BASF SE), or IRGACURE-OXE04 (manufactured by BASF SE), TR-PBG-304 (manufactured by TRONLY), ADEKA ARKLS NCI-831 and ADEKA ARKLS NCI-930 (manufactured by ADEKA CORPORATION), N-1919 (carbazole.oxime ester skeleton-containing photoinitiator (manufactured by ADEKA CORPORATION)), NCI-730 (manufactured by ADEKA CORPORATION), and the like.

Examples of oxime compounds other than the above include the compound described in JP2009-519904A in which oxime is linked to N-position of carbazole; the compound described in U.S. Pat. No. 7,626,957B in which a hetero substituent is introduced into a benzophenone moiety; the compound described in JP2010-015025A and US2009/0292039A in which a nitro group is introduced into the moiety of a coloring agent; the ketoxime compound described in WO2009/131189A; the compound described in U.S. Pat. No. 7,556,910B that contains a triazine skeleton and an oxime skeleton in the same molecule; the compound described in JP2009-221114A that has absorption maximum at 405 nm and exhibits excellent sensitivity with respect to a light source of g-line; and the like.

Furthermore, the compounds described in paragraphs "0274" and "0275" in JP2013-029760A can also be used, and the contents of these paragraphs are incorporated into the present specification.

It is preferable that the oxime compound has a maximum absorption wavelength preferably in a range of a wavelength of 350 to 500 nm, and more preferably in a range of a wavelength of 360 to 480 nm. As the oxime compound, a compound having a high absorbance at 365 nm and 405 nm is even more preferable.

From the viewpoint of sensitivity, a molar absorption coefficient of the oxime compound at 365 nm or 405 nm is preferably 1,000 to 300,000, more preferably 2,000 to 300,000, and even more preferably 5,000 to 200,000.

The molar absorption coefficient of the oxime compound can be measured by known methods. For example, it is preferable to measure the molar absorption coefficient by using an ultraviolet/visible spectrophotometer (Cary-5 spectrophotometer manufactured by Varian, Inc.) and ethyl acetate at a concentration of 0.01 g/L.

If necessary, two or more kinds of photopolymerization initiators may be used in combination.

As the photopolymerization initiator, it is also possible to use the compounds described in paragraph "0052" in JP2008-260927A, paragraphs "0033" to "0037" in JP2010-097210A, and paragraph "0044" in JP2015-068893A, and the contents of the above paragraphs are incorporated into the present specification.

(Resin Containing Acid-Decomposable Group)

The composition for forming a colored film may also contain a resin containing an acid-decomposable group.

It is preferable that the resin containing an acid-decomposable group contains a resin (hereinafter, referred to as "resin containing an acid-decomposable group" or "resin (A)" as well) having a group whose polarity is increased through decomposition by the action of an acid (hereinafter, referred to as "acid-decomposable group" as well).

In a case where the composition for forming a colored film is a positive composition, it is preferable that the composition contains the resin containing an acid-decomposable group.

It is preferable that the resin (A) has a repeating unit having an acid-decomposable group.

Examples of the resin (A) include known resins. As the resin (A), for example, it is possible to suitably use known resins disclosed in paragraphs "0055" to "0191" in US2016/0274458A1, paragraphs "0035" to "0085" in US2015/0004544A1, and paragraphs "0045" to "0090" in US2016/0147150A1.

It is preferable that the acid-decomposable group has a structure protected with a group (leaving group) that departs due to the decomposition of a polar group by the action of an acid.

Examples of the polar group include acidic groups (groups dissociated in a 2.38% by mass aqueous tetramethylammoniuim hydroxide solution) such as a carboxyl group, a phenolic hydroxyl group, fluorinated alcohol group, a sulfonic acid group, a sulfonamide group, a sulfonyl imide group, an (alkylsulfonyl) (alkylcarbonyl)methylene group, an (alkylsulfonyl) (alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group, an alcoholic hydroxyl group, and the like.

The alcoholic hydroxyl group refers to a hydroxyl group which is bonded to a hydrocarbon group and is not a hydroxyl group (phenolic hydroxyl group) directly bonded to an aromatic ring. The alcoholic hydroxyl group does not include an aliphatic alcohol (for example, a hexafluoroisopropanol group or the like) in which the α-position as a hydroxyl group is substituted with an electron-withdrawing group such as a fluorine atom. The alcoholic hydroxyl group is preferably a hydroxyl group having an acid dissociation constant (pKa) of equal to or greater than 12 and equal to or smaller than 20.

Examples of preferred polar groups include a carboxyl group, a phenolic hydroxyl group, a fluorinated alcohol group (preferably a hexafluoroisopropanol group), and a sulfonic acid group.

As the acid-decomposable group, a group is preferable which is obtained by substituting a hydrogen atom of the aforementioned polar group with a group (leaving group) that departs by the action of an acid.

Examples of the group that departs by the action of an acid include —C($R_{36}$)($R_{37}$)($R_{38}$), —C($R_{36}$)($R_{37}$)(OR$_{39}$), —C($R_{01}$)($R_{02}$)(OR$_{39}$), and the like.

In the formulae, $R_{36}$ to $R_{39}$ each independently represent an alkyl group, a cycloalkyl group, an aryl group, an aralkyl group, or an alkenyl group. $R_{36}$ and $R_{37}$ may form a ring by being bonded to each other.

$R_{01}$ and $R_{02}$ each independently represent a hydrogen atom, an alkyl group, a cycloalkyl group, an aryl group, an aralkyl group, or an alkenyl group.

The alkyl group represented by $R_{36}$ to $R_{39}$, $R_{01}$, and $R_{02}$ is preferably an alkyl group having 1 to 8 carbon atoms, and examples thereof include a methyl group, an ethyl group, a propyl group, a n-butyl group, a sec-butyl group, a hexyl group, an octyl group, and the like. The cycloalkyl group represented by $R_{36}$ to $R_{39}$, $R_{01}$, and $R_{02}$ may be monocyclic or polycyclic. As the monocyclic cycloalkyl group, a cycloalkyl group having 3 to 8 carbon atoms is preferable, and examples thereof include a cyclopropyl group, a cyclobutyl group, a cyclopentyl group, a cyclohexyl group, a cyclooctyl group, and the like. As the polycyclic cycloalkyl group, a cycloalkyl group having 6 to 20 carbon atoms is preferable, and examples thereof include an adamantly group, a norbornyl group, an isobornyl group, a camphanyl group, a dicyclopentyl group, an α-pinel group, a tricyclodecanyl group, a tetracyclododecyl group, an androstanyl group, and the like. At least one carbon atom in the cycloalkyl group may be substituted with a heteroatom such as an oxygen atom.

The aryl group represented by $R_{36}$ to $R_{39}$, $R_{01}$, and $R_{02}$ is preferably an aryl group having 6 to 14 carbon atoms, and examples thereof include a phenyl group, a naphthyl group, an anthryl group, and the like.

The aralkyl group represented by $R_{36}$ to $R_{39}$, $R_{01}$, and $R_{02}$ is preferably an aralkyl group having 7 to 12 carbon atoms, and examples thereof include a benzyl group, a phenethyl group, a naphthyl methyl group, and the like.

The alkenyl group represented by $R_{36}$ to $R_{39}$, $R_{01}$, and $R_{02}$ is preferably an alkenyl group having 2 to 8 carbon atoms, and examples thereof include a vinyl group, an allyl group, a butenyl group, a cyclohexenyl group, and the like.

The ring formed by the bonding between $R_{36}$ and $R_{37}$ is preferably a (monocyclic or polycyclic)cycloalkyl group. The cycloalkyl group is preferably a monocyclic cycloalkyl group such as a cyclopentyl group or a cyclohexyl group or a polycyclic cycloalkyl group such as a norbornyl group, a tetracyclodecanyl group, a tetracyclododecanyl group, or an adamantly group.

The acid-decomposable group is more preferably a cumyl ester group, an enol ester group, an acetal ester group, a tertiary alkyl ester group, or the like, and more preferably a tertiary alkyl ester group.

(Photoacid Generator)

The composition for forming a colored film may also contain a photoacid generator.

The photoacid generator is a compound generating an acid by being irradiated with actinic rays or radiation.

As the photoacid generator, a compound generating an organic acid by being irradiated with actinic rays or radiation is preferable. Examples thereof include a sulfonium salt compound, an iodonium salt compound, a diazonium salt compound, a phosphonium salt compound, an imidosulfonate compound, an oxime sulfonate compound, a diazodisulfone compound, a disulfone compound, and an o-nitrobenzylsulfonate compound.

As the photoacid generator, known compounds generating an acid by being irradiated with actinic rays or radiation can be appropriately selected and used singly or as a mixture. As the photoacid generator, for example, it is possible to suitably use known compounds disclosed in paragraphs "0125" to "0319" in US2016/0070167A1, paragraphs "0086" to "0094" in US2015/0004544A1, and paragraphs "0323" to "0402" in US2016/0237190A1.

(Other Components)

The composition for forming a colored film may also contain components in addition to the components described above. Examples of those other components include a resin, a polymerization inhibitor, a solvent, a surfactant, and the like. Hereinafter, those other components to be incorporated into the composition for forming a colored film will be specifically described.

It is preferable that the composition for forming a colored film contains a resin. Examples of the resin include a dispersant, an alkali-soluble resin, and the like.

The content of the resin in the composition for forming a colored film is not particularly limited. In order for the composition for forming a colored film to have further improved patterning properties, the content of the resin with respect to the total solid content of the composition for forming a colored film is preferably 5% to 45% by mass.

One kind of resin may be used singly, or two or more kinds of resins may be used in combination. In a case where two or more kinds of resins are used in combination, the total content thereof is preferably within the above range.

It is preferable that the composition for forming a colored film contains a dispersant (corresponding to a resin). In the present specification, a dispersant means a compound different from the alkali-soluble resin which will be described later.

The content of the dispersant in the composition for forming a colored film is not particularly limited. In order for the composition for forming a colored film to have further improved temporal stability and further improved patterning properties, the content of the dispersant with respect to the total solid content of the composition for forming a colored film is preferably 5% to 40% by mass.

One kind of dispersant may be used singly, or two or more kinds of dispersants may be used in combination. In a case where two or more kinds of dispersants are used in combination, the total content thereof is preferably within the above range.

As the dispersant, known dispersants can be used without particular limitation.

Examples of the dispersant include a polymer dispersant. Examples of the polymer dispersant include polyamide amine and a salt thereof, polycarboxylic acid and a salt thereof, a high-molecular-weight unsaturated acid ester, modified polyurethane, modified polyester, modified poly(meth)acrylate, a (meth)acrylic copolymer, a naphthalene-sulfonic acid formalin condensate, and the like.

Examples of the dispersant also include a polyoxyethylene alkyl phosphoric acid ester, polyoxyethylene alkyl amine, a pigment derivative, and the like.

Among these, a polymer compound is preferred as the dispersant. The polymer compound can be further classified into a linear polymer, a terminal-modified polymer, a graft polymer, and a block polymer based on the structure thereof.

(Polymer Compound)

The polymer compound functions to prevent the reaggregation of a pigment by being adsorbed onto the surface of the pigment. Therefore, as the polymer compound, a terminal-modified polymer, a graft polymer (containing a polymer chain), and a block polymer are preferable which contain a moiety anchored to the pigment surface.

It is preferable that the polymer compound contains a structural unit containing a graft chain. In the present specification, "structural unit" has the same definition as "repeating unit".

The polymer compound which contains the structural unit containing a graft chain exhibits higher affinity with a solvent. Because the polymer compound which contains a structural unit containing a graft chain exhibits higher affinity with a solvent, the polymer compound more easily disperses the pigment and the like and makes it more difficult for the initial dispersion state to change even after the lapse of time after the pigment and the like are dispersed. In addition, because the polymer compound which contains a structural unit containing a graft chain contains a graft chain, the polymer compound exhibits higher affinity with the polymerizable compound, which will be described later, and/or other components and the like. Consequently, at the time of alkali development which will be described later, the polymer compound which contains a structural unit containing a graft chain hardly generates residues resulting from an unreacted polymerizable compound and the like.

The longer the graft chain (the larger the formula weight), the stronger the steric repulsion effect, and hence the dispersibility of the pigment and the like is improved. In contrast, in a case where the graft chain is too long, the adsorptivity with respect to the pigment and the like is reduced, and hence the dispersibility of the pigment and the like tends to be reduced. Therefore, the number of atoms (except for hydrogen atoms) constituting the graft chain is preferably 40 to 10,000, more preferably 50 to 2,000, and even more preferably 60 to 500.

Herein, the graft chain means a portion from the base of a main chain of the polymer compound (an atom bonded to the main chain in a group which is branched off the main chain) to the terminal of a group branching off the main chain.

As the graft chain, a polymer chain containing a polymer structure is preferable. The polymer structure that the polymer chain contains is not particularly limited, and examples thereof include a poly(meth)acrylate structure (for example, a poly(meth)acryl structure), a polyester structure, a polyurethane structure, a polyurea structure, a polyamide structure, a polyether structure, and the like.

In order for higher affinity to be exhibited with a polymer chain and a solvent and for the polymer compound to more easily disperse the pigment and the like, the polymer chain preferably contains at least one kind of structure selected from the group consisting of a polyester structure, a polyether structure, and a poly(meth)acrylate structure, and more preferably contains at least one kind of structure selected from the group consisting of a polyester structure and a polyether structure.

Examples of commercial macromonomers, which correspond to the structural unit containing a polymer chain contained in the polymer compound and can be used for synthesizing the polymer compound, include AA-6, AA-10, AB-6, AS-6, AN-6, AW-6, AA-714, AY-707, AY-714, AK-5, AK-30, and AK-32 (trade names, manufactured by TOA-GOSEI CO., LTD.); BLEMMER PP-100, BLEMMER PP-500, BLEMMER PP-800, BLEMMER PP-1000, BLEMMER 55-PET-800, BLEMMER PME-4000, BLEMMER PSE-400, BLEMMER PSE-1300, and BLEMMER 43PAPE-600B (trade names, manufactured by NOF CORPORATION); and the like.

The aforementioned dispersant preferably contains at least one kind of structure selected from the group consisting of polymethyl acrylate, polymethyl methacrylate, and cyclic or linear polyester, more preferably contains at least one kind of structure selected from the group consisting of polymethyl acrylate, polymethyl methacrylate, and linear polyester, and even more preferably contains at least one kind of structure selected from the group consisting of a polymethyl acrylate structure, a polymethyl methacrylate structure, a polycaprolactone structure, and a polyvalerolactone structure.

The dispersant may contain only one kind of the aforementioned structure in a molecule or plural kinds of the aforementioned structures in a molecule.

The polycaprolactone structure refers to a structure containing a structure, which is obtained by ring opening of ε-caprolactone, as a repeating unit. The polyvalerolactone structure refers to a structure containing a structure, which is obtained by ring opening of δ-valerolactone, as a repeating unit.

It is preferable that the polymer compound contains a hydrophobic structural unit different from the structural unit containing a graft chain (that is, a hydrophobic structural unit which does not correspond to the structural unit containing a graft chain). Here, in the present specification, the hydrophobic structural unit is a structural unit which does not contain an acid group (for example, a carboxylic acid group, a sulfonic acid group, a phosphoric acid group, a phenolic hydroxyl group, or the like).

As the hydrophobic structural unit, a structural unit derived from (corresponding to) a compound (monomer) having a C log P value, which will be described later, equal to or greater than 1.2 is preferable, and a structural unit derived from a compound having a C log P value of 1.2 to 8.0 is more preferable.

The C log P value is a value calculated by a program "CLOGP" available from Daylight Chemical Information System, Inc. This program provides a value of "calculated log P" calculated by the fragment approach (see the following documents) of Hansch and Leo. The fragment approach is based on the chemical structure of a compound. In this method, the chemical structure is divided into partial structures (fragments), and degrees of contribution to log P that are assigned to the fragments are summed up, thereby estimating the log P value of the compound. Details of the method are described in the following documents. In the present invention, a C log P value calculated by a program CLOGP v 4.82 is used.

A. J. Leo, Comprehensive Medicinal Chemistry, Vol. 4, C. Hansch, P. G. Sammnens, J. B. Taylor and C. A. Ramsden, Eds., p. 295, Pergamon press, 1990, C. Hansch & A. J. Leo. Substituent Constants For Correlation Analysis in Chemistry and Biology. John Wiley & Sons., A. J. Leo. Calculating log Poct from structure. Chem. Rev., 93, 1281-1306, 1993.

log P means a common logarithm of a partition coefficient P. log P is a value of physical properties that shows how a certain organic compound is partitioned in an equilibrium of two-phase system consisting of oil (generally, 1-octanol) and water by using a quantitative numerical value. log P is represented by the following formula.

$$\log P = \log(C_{oil}/C_{water})$$

In the formula, Coil represents a molar concentration of a compound in an oil phase, and Cwater represents a molar concentration of the compound in a water phase.

The greater the positive log P value based on 0, the higher the oil solubility. The greater the absolute value of negative log P, the higher the water solubility. The value of log P is negatively correlated with the water solubility of an organic compound, and widely used as a parameter for estimating the hydrophilicity and hydrophobicity of an organic compound.

It is preferable that the polymer compound contains a functional group capable of interacting with the pigment and the like. That is, it is preferable that the polymer compound further contains a structural unit containing a functional group capable of interacting with the pigment and the like.

Examples of the functional group capable of interacting with the pigment and the like include an acid group, a basic group, a coordinating group, a reactive functional group, and the like.

In a case where the polymer compound contains an acid group, a basic group, a coordinating group, or a reactive functional group, it is preferable that the polymer compound contains each of a structural unit containing an acid group, a structural unit containing a basic group, a structural unit containing a coordinating group, or a reactive structural unit.

Particularly, in a case where the polymer compound further contains, as an acid group, an alkali-soluble group such as a carboxylic acid group, developability for forming a pattern by alkali development can be imparted to the polymer compound.

That is, in a case where an alkali-soluble group is introduced into the polymer compound, in the composition for forming a colored film, the polymer compound as a dispersant making a contribution to the dispersion of the pigment and the like also has alkali solubility. The composition for forming a colored film containing such a polymer compound has better alkali developability (an unexposed portion is more easily dissolved by alkali development).

The polymer compound containing an acid group exhibits higher affinity with the solvent which will be described later.

Accordingly, the composition for forming a colored film that contains the polymer compound containing an acid group has better coating properties.

Presumably, this is because the acid group in the structural unit containing an acid group may easily interact with the pigment and the like, the polymer compound may stably disperse the pigment and the like, the viscosity of the polymer compound dispersing the pigment and the like may be further reduced, and hence the polymer compound may also be easily dispersed in a stable manner.

The structural unit containing an alkali-soluble group as an acid group may be the same as or different from the structural unit containing a graft chain described above.

In the present specification, the structural unit containing an alkali-soluble group as an acid group means a structural unit different from the hydrophobic structural unit described above (that is, the structural unit does not correspond to the hydrophobic structural unit).

Among functional groups capable of interacting with the pigment and the like, examples of acid groups include a carboxylic acid group, a sulfonic acid group, a phosphoric acid group, a phenolic hydroxyl group, and the like. Among these, at least one kind of acid group selected from the group consisting of a carboxylic acid group, a sulfonic acid group, and a phosphoric acid group is preferable, and a carboxylic acid group is more preferable because this group exhibits higher adsorptivity with respect to the pigment and the like and has better dispersibility.

That is, it is preferable that the polymer compound further contains a structural unit which contains at least one kind of acid group selected from the group consisting of a carboxylic acid group, a sulfonic acid group, and a phosphoric acid group.

The polymer compound may have one kind of structural unit containing an acid group or two or more kinds of structural units containing an acid group.

The polymer compound may or may not contain the structural unit containing an acid group.

In the polymer compound, the content of the structural unit containing an acid group with respect to the total mass of the polymer compound is preferably 5% to 80% by mass, and more preferably 10% to 60% by mass in view of further inhibiting the image intensity from being damaged by alkali development.

Among the functional groups capable of interacting with the pigment and the like, examples of basic groups include a primary amino group, a secondary amino group, a tertiary amino group, a hetero ring containing a N atom, an amide group, and the like. Among these, a tertiary amino group is preferable because this exhibits higher adsorptivity with respect to the pigment and the like and has better dispersibility. The polymer compound may contain one kind of basic group or two or more kinds of basic groups. The polymer compound may or may not contain the structural unit containing a basic group.

In the polymer compound, the content of the structural unit containing a basic group with respect to the total mass of the polymer compound is preferably 0.01% to 50% by mass, and more preferably 0.01% to 30% by mass because then the composition for forming a colored film has better developability (because then it is more difficult for the alkali development to be hindered).

Among the functional groups capable of interacting with the pigment and the like, examples of coordinating groups and reactive functional groups include an acetyl acetoxy group, a trialkoxysilyl group, an isocyanate group, an acid anhydride group, an acid chloride group, and the like.

Among these, acetyl acetoxy group is preferable because this exhibits higher adsorptivity with respect to the pigment and the like and more easily disperses the pigment and the like. The polymer compound may contain one kind of coordinating group and one kind of reactive functional group, or contain two or more kinds of coordinating groups and reactive functional groups. The polymer compound may or may not contain both the structural unit containing a coordinating group and structural unit containing a reactive functional group.

In the polymer compound, the content of the structural unit containing a coordinating group and the reactive functional group with respect to the total mass of the polymer compound is preferably 10% to 80% by mass, and more preferably 20% to 60% by mass because then the composition for forming a colored film has better developability (because then it is more difficult for the alkali development to be hindered).

In the polymer compound, from the viewpoint of the interaction with the pigment and the like, the temporal stability, and the permeability with respect to a developer, the content of the structural unit containing a functional group capable of interacting with the pigment and the like with respect to the total mass of the polymer compound is preferably 0.05% to 90% by mass, more preferably 1.0% to 80% by mass, and even more preferably 10% to 70% by mass.

For the purpose of improving various performances such as image intensity, as long as the effects of the present invention are not impaired, the polymer compound may further contain other structural units (for example, a structural unit containing a functional group or the like having affinity with the solvent used in a dispersed composition, and the like) that are different from the structural unit containing a graft chain, the hydrophobic structural unit, and the structural unit containing a functional group capable of interacting with the pigment and the like.

Examples of those other structural units include structural units derived from radically polymerizable compounds selected from the group consisting of acrylonitriles and methacrylonitriles, and the like.

The polymer compound may contain one kind of those other structural units or two or more kinds of those other structural units.

In the polymer compound, the content of those other structural units with respect to the total mass of the polymer compound is preferably 0% to 80% by mass, and more preferably 10% to 60% by mass. In a case where the content of those other structural units is 0% to 80% by mass, the composition for forming a colored film has better pattern forming properties.

The acid value of the polymer compound is not particularly limited, but is preferably 0 to 250 mgKOH/g, more preferably 10 to 200 mgKOH/g, and even more preferably 20 to 120 mgKOH/g.

The acid value of the polymer compound can be calculated, for example, from the average content of acid groups in the polymer compound. Furthermore, by changing the content of the acid group-containing structural unit in the polymer compound, a polymer compound having the desired acid value can be obtained.

In order for the composition for forming a colored film to have better developability and in order to make it more difficult for the obtained colored film to be peeled in the development step, the weight-average molecular weight of the polymer compound that is determined by Gel Permeation Chromatography (GPC) and expressed in terms of polystyrene is preferably 4,000 to 300,000, more preferably 5,000 to 200,000, even more preferably 6,000 to 100,000, and particularly preferably 10,000 to 50,000.

GPC is based on a method of using HLC-8020GPC (manufactured by Tosoh Corporation), TSKgel SuperHZM-H, TSKgel SuperHZ4000, and TSKgel SuperHZ2000 (manufactured by Tosoh Corporation, 4.6 mmID×15 cm) as columns, and tetrahydrofuran (THF) as an eluent. The polymer compound can be synthesized based on known methods.

Specific examples of the polymer compound include "DA-7301" manufactured by Kusumoto Chemicals. Ltd., "Disperbyk-101 (polyamidoamine phosphate), 107 (carboxylic acid ester), 110 (copolymer containing an acid group), 111 (phosphoric acid-based dispersant), 130 (polyamide), 161, 162, 163, 164, 165, 166, 170, and 190 (polymeric copolymer)" and "BYK-P104 and P105 (high-molecular-weight unsaturated polycarboxylic acid)" manufactured by BYKChemie GmbH, "EFKA 4047, 4050 to 4010 to 4165 (based on polyurethane), EFKA 4330 to 4340 (block copolymer), 4400 to 4402 (modified polyacrylate), 5010 (polyester amide), 5765 (high-molecular-weight carboxylate), 6220 (aliphatic polyester), 6745 (phthalocyanine derivative), and 6750 (azo pigment derivative" manufactured by EFKA, "AJISPER PB821, PB822, PB880, andPB881" manufactured by Ajinomoto Fine-Techno Co., Inc., "FLOWLEN TG-710 (urethane oligomer)" and "POLYFLOW No. 50E, No. 300 (acrylic copolymer)" manufactured by KYOEISHA CHEMICAL Co., LTD, "DISPARLON KS-860, 873SN, 874, #2150 (aliphatic polyvalent carboxylic acid), #7004 (polyether ester), DA-703-50, DA-705, and DA-725" manufactured by Kusumoto Chemicals. Ltd., "DEMOL RN, N (naphthalenesulfonic acid formalin polycondensate), MS, C, and SN-B (aromatic sulfonic acid formalin polycondensate)", "HOMOGENOL L-18 (polymeric polycarboxylic acid)", "EMULGEN 920, 930, 935, and 985 (polyoxyethylene nonylphenyl ether)", and "ACETAMIN 86 (stearylamine acetate)" manufactured by Kao Corporation, "SOLSPERSE 5000 (phthalocyanine derivative), 22000 (azo pigment derivative), 13240 (polyester amine), 3000, 12000, 17000, 20000, 27000 (polymer containing a functional portion on a terminal portion), 24000, 28000, 32000, and 38500 (graft copolymer)" manufactured by Lubrizol Japan Limited, "NIKKOL T106 (polyoxyethylene sorbitan monooleate), and MYS-IEX (polyoxyethylene monostearate)" manufactured by Nikko Chemicals Co., Ltd., HINOACT T-8000E and the like manufactured by Kawaken Fine Chemicals Co., Ltd., an organosiloxane polymer KP-341 manufactured by Shin-Etsu Chemical Co., Ltd., "W001: cationic surfactant" manufactured by Yusho Co., Ltd., nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and a sorbitan fatty acid ester, anionic surfactants such as "W004, W005, and W017", polymer dispersants such as "EFKA-46, EFKA-47, EFKA-47EA, EFKA polymer 100, EFKA polymer 400, EFKA polymer 401, and EFKA polymer 450" manufactured by MORISHITA & CO., LTD., and "DISPERSE AID 6, DISPERSE AID 8, DISPERSE AID 15, and DISPERSE AID 9100" manufactured by SAN NOPCO LIMITED, "ADEKA PLURONIC L31, F38, L42, L44, L61, L64, F68, L72, P95, F77, P84, F87, P94, L101, P103, F108, L121, and P-123" manufactured by ADEKA CORPORATION, "IONET (trade name)S-20" manufactured by Sanyo Chemical Industries, Ltd., and the like. Furthermore, ACRYBASE FFS-6752, ACRYBASE FFS-187, ACRYCURE RD-F8, and CYCLOMER P can also be used. Furthermore, it is also possible to use DISPERBYK-130, DISPERBYK-140, DISPERBYK-142, DISPERBYK-145, DISPERBYK-180, DISPERBYK-187, DISPERBYK-191, DISPERBYK-2001, DISPERBYK-2010, DISPERBYK-2012, DISPERBYK-2025, and BYK-9076 manufactured by BYKChemie GmbH, AJISPER PB821, AJISPER PB822, and AJISPER PB881 manufactured by Ajinomoto Fine-Techno Co., Inc., and the like.

One kind of these polymer compounds may be used singly, or two or more kinds of these polymer compounds may be used in combination.

As the polymer compound, the compounds described in paragraphs "0127" to "0129" in JP2013-249417A can also be used, and the contents of the paragraphs are incorporated into the present specification.

Furthermore, as a dispersant, it is also possible to use the graft copolymers described in paragraphs "0037" to "0115" in JP2010-106268A (paragraphs "0075" to "0133" in US2011/0124824A corresponding to JP2010-106268A), and the contents of the paragraphs are incorporated into the present specification.

In addition, as a dispersant, it is also possible to use the polymer compounds described in paragraphs "0028" to "0084" in JP2011-153283A (paragraphs "0075" to "0133" in US2011/0279759A corresponding to JP2011-153283A) that contain a constituent component containing a side chain structure formed by bonding of acidic groups through a linking group, and the contents of the paragraphs are incorporated into the present specification.

Moreover, as a dispersant, the resins described in paragraphs "0033" to "0049" in JP2016-109763A can also be used, and the contents of the paragraphs are incorporated into the present specification.

It is preferable that the composition for forming a colored film contains an alkali-soluble resin (corresponding to a resin). In the present specification, the alkali-soluble resin means a resin which contains a group promoting alkali solubility (alkali-soluble group) and is different from the dispersant described above.

The content of the alkali-soluble resin in the composition for forming a colored film is not particularly limited. In order for the composition for forming a colored film to have better patterning properties, the content of the alkali-soluble resin with respect to the total solid content of the composition for forming a colored film is 0.5% to 30% by mass.

One kind of alkali-soluble resin may be used singly, or two or more kinds of alkali-soluble resins may be used in combination. In a case where two or more kinds of alkali-soluble resins are used in combination, the total content thereof is preferably within the above range.

Examples of the alkali-soluble resin include a resin containing at least one alkali-soluble group in a molecule. Examples thereof include a polyhydroxystyrene resin, a polysiloxane resin, a (meth)acryl resin, a (meth)acrylamide resin, a (meth)acryl/(meth)acrylamide copolymer resin, an epoxy-based resin, a polyimide resin, and the like.

Specific examples of the alkali-soluble resin include a copolymer of an unsaturated carboxylic acid and an ethylenically unsaturated compound.

The unsaturated carboxylic acid is not particularly limited, and examples thereof include monocarboxylic acids such as (meth)acrylic acid, crotonic acid, and vinyl acetate; dicarboxylic acid such as itaconic acid, maleic acid, or fumaric acid or an acid anhydride of these; polyvalent carboxylic acid monoesters such as mono(2-(meth)acryloyloxyethyl)phthalate; and the like.

Examples of copolymerizable ethylenically unsaturated compounds include methyl (meth)acrylate and the like. Furthermore, it is also possible to use the compounds described in paragraph "0027" in JP2010-097210A and paragraphs "0036" and "0037" in JP2015-068893A, and the contents of the paragraphs are incorporated into the present specification.

Furthermore, copolymerizable ethylenically unsaturated compounds containing an ethylenically unsaturated group on a side chain may also be used in combination. As the ethylenically unsaturated group, a (meth)acrylic acid group is preferable. An acrylic resin containing an ethylenically unsaturated group on a side chain can be obtained, for example, by addition-reacting a carboxylic acid group of an acrylic resin containing a carboxylic acid group with an ethylenically unsaturated compound containing a glycidyl group or an alicyclic epoxy group.

As the alkali-soluble resin, for example, it is possible to use the radical polymer containing a carboxylic acid group on a side chain described in JP1984-044615A (JP-S59-044615A), JP1979-034327B (JP-S54-034327B), JP1983-012577B (JP-S58-012577B), JP1979-025957B (JP-S54-025957B), JP1979-092723A (JP-S54-092723A), JP1984-053836A (JP-S59-053836A), and JP1984-071048A (JP-S59-071048A); the acetal-modified polyvinyl alcohol-based binder resin containing an alkali-soluble group described in EP993966B, EP1204000B, and JP2001-318463A; polyvinyl pyrrolidone; polyethylene oxide; polyether as a product of a reaction between alcohol-soluble nylon, 2,2-bis-(4-hydroxyphenyl)-propane, and epichlorohydrin; the polyimide resin described in WO2008/123097A; and the like.

As the alkali-soluble resin, the compounds described in paragraphs "0225" to "0245" in JP2016-075845A can also be used, and the contents of the paragraphs are incorporated into the present specification.

As the alkali-soluble resin, a polyimide precursor can also be used. The polyimide precursor means a resin obtained by causing an addition polymerization reaction between a compound containing an acid anhydride group and a diamine compound at a temperature of 40° C. to 100° C.

(Surfactant)

It is preferable that the composition for forming a colored film contains a surfactant. The composition for forming a colored film containing a surfactant has better coating properties.

The content of the surfactant in the composition for forming a colored film is not particularly limited. The content of the surfactant with respect to the total solid content of the composition for forming a colored film is preferably 0.001% to 2.0% by mass.

One kind of surfactant may be used singly, or two or more kinds of surfactants may be used in combination. In a case where two or more kinds of surfactants are used in combination, the total content thereof is preferably within the above range.

Examples of the surfactant include a fluorine-based surfactant, a nonionic surfactant, a cationic surfactant, an anionic surfactant, a silicone-based surfactant, and the like.

For example, in a case where the composition for forming a colored film contains a fluorine-based surfactant, the liquid characteristics (particularly, fluidity) of the composition for forming a colored film are further improved. That is, in a case where the film of the composition for forming a colored film is formed on a substrate by using the composition for forming a colored film containing the fluorine-based surfactant, the interfacial tension between the substrate and composition for forming a colored film is reduced, and accordingly, the wettability with respect to the substrate is improved, and the coating properties of the composition for forming a colored film are improved. Therefore, even in a case where the film of the composition for forming a colored film having a thickness of about several micrometers is formed of a small amount of the composition, the film of the composition for forming a colored film having a more uniform thickness and small thickness unevenness can be formed.

The content of fluorine in the fluorine-based surfactant is not particularly limited, but is preferably 3% to 40% by mass, more preferably 5% to 30% by mass, and even more preferably 7% to 25% by mass. In a case where a composition for forming a colored film, which contains a fluorine-based surfactant with a fluorine content of 3% to 40% by mass, is used, the film of the composition for forming a colored film having a more uniform thickness can be formed. As a result, the composition for forming a colored film has better liquid saving properties. Furthermore, in a case where the fluorine content is within the above range, the fluorine-based surfactant is more easily dissolved in the composition for forming a colored film.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, and MEGAFACE F780 (manufactured by DIC Corporation), FLUORAD FC430, FLUORAD FC431, and FLUORAD FC171 (manufactured by Sumitomo 3M Limited), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (manufactured by ASAHI GLASS CO., LTD.), PF636, PF656, PF6320, PF6520, and PF7002 (manufactured by OMNOVA Solutions Inc.), and the like.

As the fluorine-based surfactant, a block polymer can also be used. For example, the compounds described in JP2011-089090A can also be used, and the content of the document is incorporated into the present specification.

(Solvent)

It is preferable that the composition for forming a colored film contains a solvent. As the solvent, known solvents can be used without particular limitation.

The content of the solvent in the composition for forming a colored film is not particularly limited. Generally, the content of the solvent is preferably adjusted such that the content is 20% to 90% by mass with respect to the concentration of the solid contents of the composition for forming a colored film, and more preferably adjusted such that the content is 25% to 50% by mass with respect to the concentration of the solid contents of the composition for forming a colored film.

One kind of solvent may be used singly, or two or more kinds of solvents may be used in combination. In a case where two or more kinds of solvents are used in combination, it is preferable that the content thereof is adjusted such that the total solid content of the composition for forming a colored film falls into the above range.

Examples of the solvent include water and an organic solvent.

Examples of the organic solvent include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, ethyl acetate, butyl acetate, methyl lactate, N-methyl-2-pyrrolidone, ethyl lactate, and the like.

(Ultraviolet Absorber)

The composition for forming a colored film may contain an ultraviolet absorber.

As the ultraviolet absorber, it is possible to use ultraviolet absorbers based on salicylate, benzophenone, benzotriazole, substituted acrylonitrile, triazine, and the like.

For examples, as the ultraviolet absorber, the compounds described in paragraphs "0137" to "0142" in JP2012-068418A (paragraphs "0251" to "0254" in US2012/0068292A corresponding to JP2012-068418A) can be used, and the contents of the paragraphs are incorporated into the present specification.

As the ultraviolet absorber, a diethylamino-phenylsulfonyl-based ultraviolet absorber (manufactured by DAITO CHEMICAL CO., LTD., trade name: UV-503) and the like can also be used.

As the ultraviolet absorber, the compounds described in paragraphs "0134" to "0148" in JP2012-032556A can also be used, and the contents of the paragraphs are incorporated into the present specification.

The content of the ultraviolet absorber in the composition for forming a colored film is not particularly limited. Generally, the content of the ultraviolet absorber with respect to the total solid content of the composition for forming a colored film is preferably 0.001% to 15% by mass.

(Silane Coupling Agent)

The composition for forming a colored film may contain a silane coupling agent.

In the present specification, the silane coupling agent means a compound containing the following hydrolyzable group and other functional groups in a molecule. The hydrolyzable group refers to a substituent which is directly bonded to a silicon atom and can form a siloxane bond by a hydrolysis reaction and/or a condensation reaction. Examples of the hydrolyzable group include a halogen atom, an alkoxy group, an acyloxy group, and an alkenyloxy group directly bonded to a silicon atom. In a case where the hydrolyzable group contains carbon atoms, the number of carbon atoms is preferably equal to or smaller than 6, and more preferably equal to or smaller than 4. Particularly, an alkoxy group having 4 or less carbon atoms or an alkenyloxy group having 4 or less carbon atoms is preferable.

In the composition for forming a colored film, the content of the silane coupling agent with respect to the total solid content in the composition for forming a colored film is preferably 0.1% to 10% by mass.

One kind of silane coupling agent may be used singly, or two or more kinds of silane coupling agents may be used in combination. In a case where two or more kinds of silane coupling agents are used in combination, the total content thereof is preferably within the above range.

(Acid Diffusion Control Agent)

The composition for forming a colored film may also contain an acid diffusion control agent.

The acid diffusion control agent functions as a quencher which entraps acids generated from the photoacid generator or the like at the time of exposure so as to inhibit the acid-decomposable resin from reacting in an unexposed portion by the excess of acids generated. For example, as the acid diffusion control agent, it is possible to use a basic compound, a basic compound whose basicity is reduced or disappears by the irradiation of actinic rays or radiation, an onium salt which is a weak acid relative to an acid generator, a low-molecular-weight compound which has a nitrogen atom and a group that departs by the action of an acid, an onium salt compound which has a nitrogen atom in a cationic portion, and the like.

[Manufacturing Method of Composition for Forming a Colored Film]

The aforementioned dispersion composition can be prepared by mixing together the aforementioned components by known mixing methods (for example, mixing methods using a stirrer, a homogenizer, a high-pressure emulsification device, a wet-type pulverizer, a wet-type disperser, and the like). At the time of preparing the composition for forming a colored film, the components may be mixed together at the same time, or the components may be dissolved or dispersed in a solvent and then sequentially mixed together. The order of adding the components and the operation condition at the time of mixing are not particularly limited.

For the purpose of removing foreign substances, reducing defects, and the like, it is preferable that the composition for forming a colored film is filtered through a filter. As the filter, known filters can be used without particular limitation.

It is preferable that the composition for forming a colored film substantially does not contain impurities such as a metal (particles and ions), a metal salt containing halogen, an acid, and an alkali. In the present specification, "substantially does not contain" means that the impurities are undetectable by the following measurement method.

The content of the impurity contained in the composition for forming a colored film, the aforementioned components, the aforementioned filter, and the like is not particularly limited. The content of the impurity with respect to the total mass of each of the composition for forming a colored film, the aforementioned component, the aforementioned filter, and the like is preferably equal to or smaller than 1 mass ppm, more preferably equal to or smaller than 1 mass ppb, even more preferably equal to or smaller than 100 mass ppt, and particularly preferably equal to or smaller than 10 mass ppt. It is most preferable that the composition for forming a colored film, the aforementioned components, the aforementioned filter, and the like substantially do not contain the impurity.

The content of the impurity can be measured using an inductively coupled plasma mass spectrometer (manufactured by Yokogawa Analytical Systems, Inc., Agilent 7500cs model).

ppm represents parts per million, ppb represents parts per billion, and ppt represents parts per trillion.

The colored film is suitable for a light blocking member, a light blocking film, an antireflection member, and an antireflection film of optical filters and modules used in portable instruments such as a personal computer, a tablet PC, a mobile phone, a smartphone, and a digital camera; office automation (OA) instruments such as a printer composite machine and a scanner; industrial instruments such as monitoring camera, a barcode reader, an automated teller machine (ATM), a high-speed camera, an instrument having a personal authentication function exploiting face image recognition; camera instruments for automobile use; medical camera instruments such as an endoscope, a capsule endoscope, and a catheter; an infrared sensor, a biosensor, a military reconnaissance camera, a camera for a three-dimensional map, a camera for observing weather and sea, a camera for land resource investigation, space instruments such as an exploration camera for the astronomy of the universe and a deep space target; and the like.

Particularly, it is preferable that the colored film is used as a light blocking film on a photosensor.

The colored film can also be used in a micro light emitting diode (LED), a micro organic light emitting diode (OLED), and the like. The colored film is suitable for an optical filter and an optical film used in the micro LED and the micro OLED and for a member to which a light blocking function or an antireflection function is to be imparted.

Examples of the micro LED and the micro OLED include those described in JP2015-500562A and JP2014-533890A.

The colored film is suitable as an optical filter and an optical film used in a quantum dot display. Furthermore, the colored film is suitable as a member to which a light blocking function or an antireflection function is to be imparted.

Examples of the quantum dot display include those described in US2013/0335677A, US2014/0036536A, US2014/0036203A, and US2014/0035960A.

<Solid-State Imaging Device and Solid-State Imaging Element>

The solid-state imaging device and the solid-state imaging element according to an embodiment of the present invention include the colored film described above. The aspect in which the solid-state imaging element includes the cured film is not particularly limited. For example, a constitution may be adopted in which a plurality of photodiodes and light-receiving elements formed of polysilicon or the like constituting a light-receiving area of a solid-state imaging element (a Charge Coupled Device (CCD) image sensor, a complementary metal oxide semiconductor (CMOS) image sensor, or the like) are provided on a substrate, and solid-state imaging element comprises the colored film on a surface side of a support on which the light-receiving elements are formed (for example, a portion other than light-receiving portions and/or pixels for adjusting color, and the like) or on a side opposite to the surface on which the light-receiving elements are formed.

The solid-state imaging device includes the aforementioned solid-state imaging element.

Figure 5:
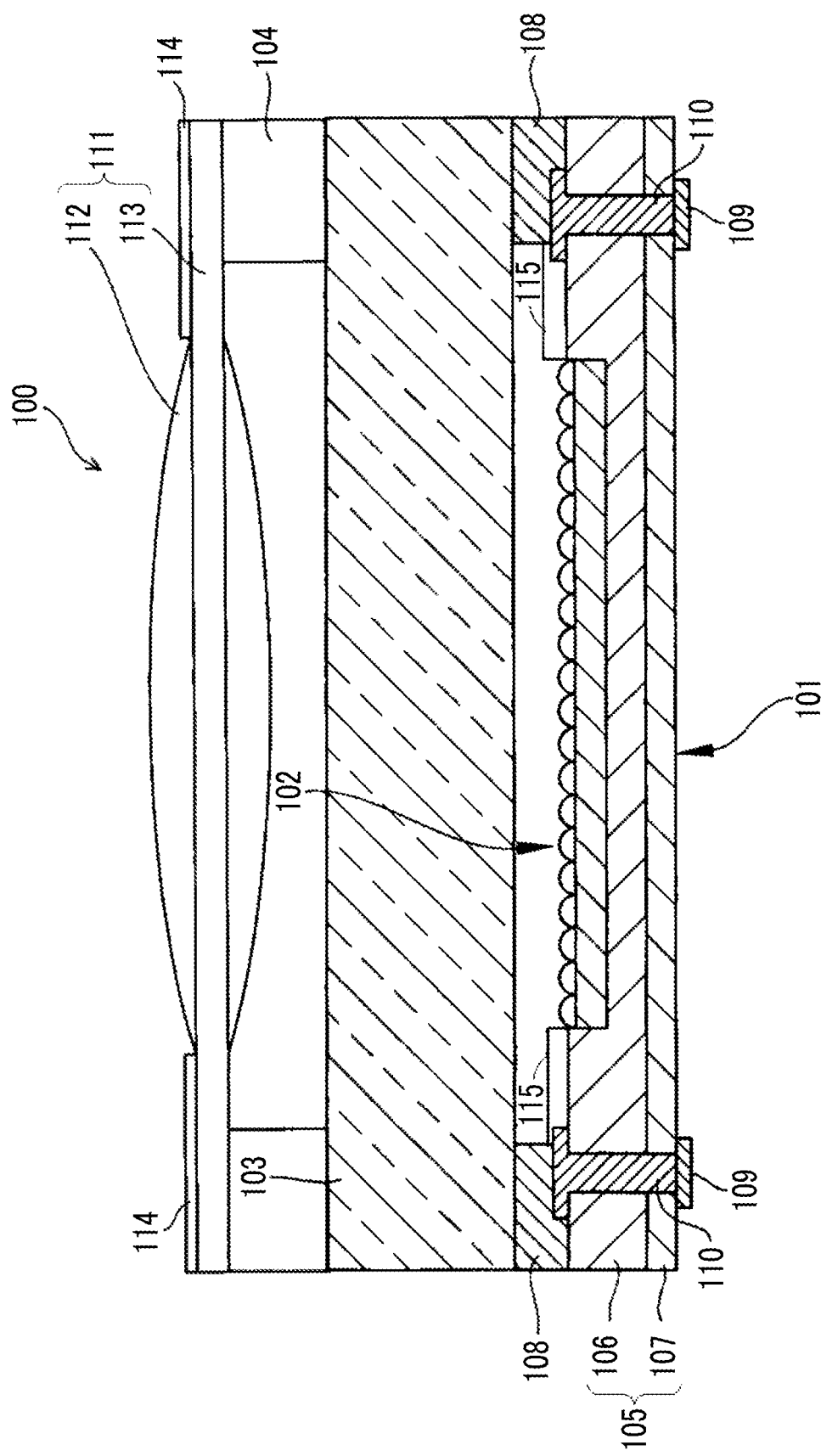
FIG. 5 is a schematic cross-sectional view showing a constitution example of a solid-state imaging element.
Figure 6:
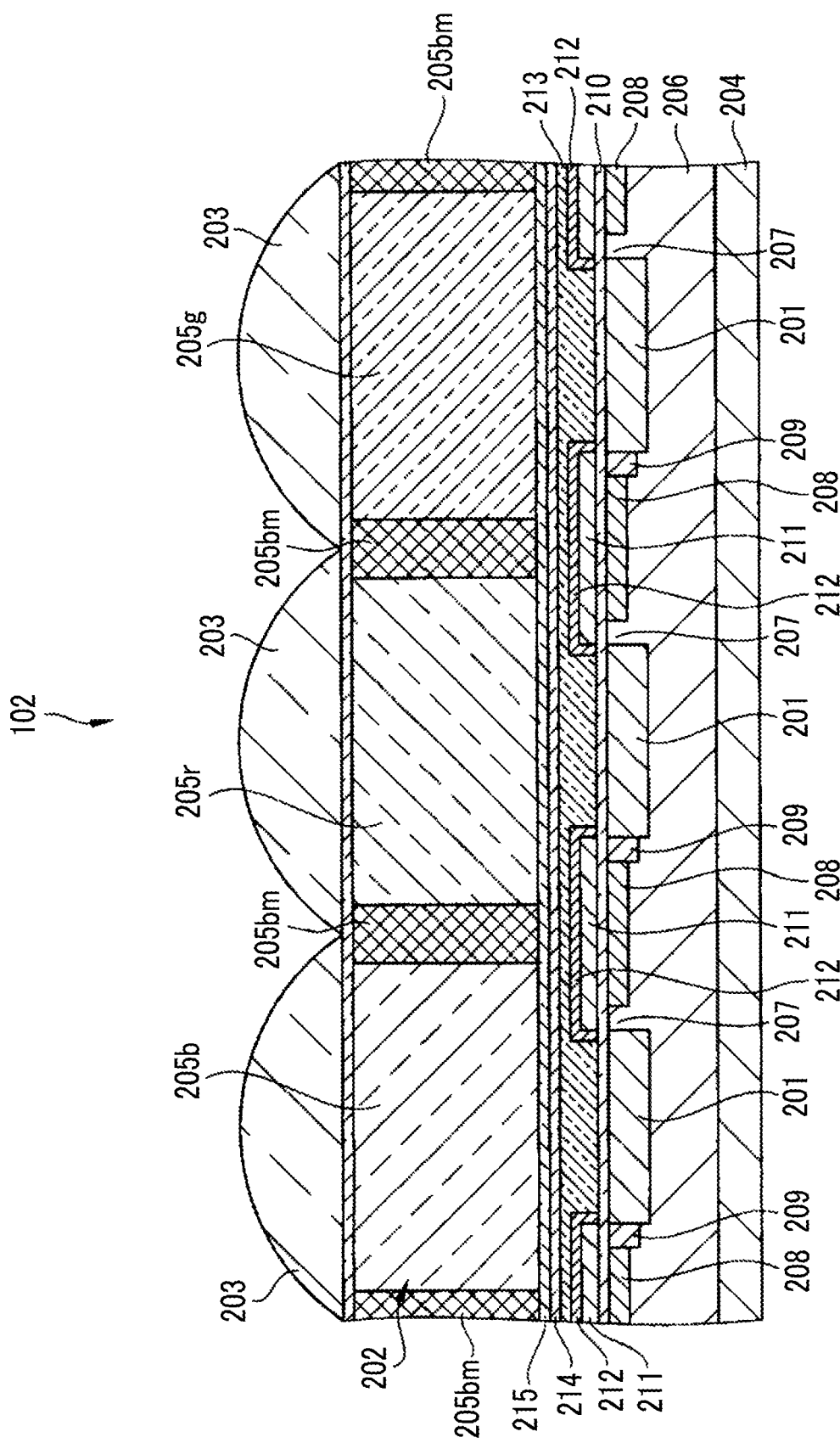
FIG. 6 is an enlarged schematic cross-sectional view showing an imaging portion in FIG. 5.

Examples of the constitutions of the solid-state imaging device and the solid-state imaging element will be described with reference to FIG. 5 and FIG. 6. In FIG. 5 and FIG. 6, in order that each portion is clearly seen, some portions are magnified in disregard of a thickness ratio and/or a width ratio between the portions.

As shown in FIG. 5, a solid-state imaging device 100 comprises a rectangular solid-state imaging element 101 and a transparent cover glass 103 which is held above the solid-state imaging element 101 and seals the solid-state imaging element 101. Furthermore, on the cover glass 103, a lens layer 111 is superposed through a spacer 104. The lens layer 111 is constituted with a support 113 and a lens material 112. The lens layer 111 may be constituted with the support 113 and the lens material 112 that are integrally formed. In a case where stray light comes into the peripheral region of the lens layer 111, due to the diffusion of light, a light condensing effect of the lens material 112 is weakened. Accordingly, the light reaching an imaging portion 102 is reduced, and noise occurs due to the stray light. Therefore, a colored film 114 is provided in the peripheral region of the lens layer 111 such that light is blocked.

The solid-state imaging element 101 performs photoelectric conversion on an optical image formed on the imaging portion 102, which is a light-receiving surface of the solid-state imaging element 101, and outputs the converted optical image as an image signal. The solid-state imaging element 101 comprises a laminated substrate 105 obtained by laminating two sheets of substrates. The laminated substrate 105 is formed of a chip substrate 106 and a circuit substrate 107 that are rectangular substrates having the same size. The circuit substrate 107 is laminated on the rear surface of the chip substrate 106.

As the material of the substrate used as the chip substrate 106, known materials can be used without particular limitation.

The imaging portion 102 is provided in the central portion of the surface of the chip substrate 106. In a case where stray light comes into the peripheral region of the imaging portion 102, a dark current (noise) occurs from the circuit in the peripheral region. Therefore, the peripheral region is provided with a colored film 115 such that light is blocked.

A plurality of electrode pads 108 are provided at the edge of the surface of the chip substrate 106. The electrode pads 108 are electrically connected to the imaging portion 102 through a signal line (a bonding wire can also be used) not shown in the drawing that is provided on the surface of the chip substrate 106.

On the rear surface of the circuit substrate 107, external connection terminals 109 are provided approximately in positions below the electrode pads 108. The external connection terminals 109 are connected to the electrode pads 108 through a penetration electrode 110 vertically penetrating the laminated substrate 105. Furthermore, the external connection terminals 109 are connected to a control circuit controlling the driving of the solid-state imaging element 101, an image processing circuit performing image processing on an imaging signal output from the solid-state imaging element 101, and the like through wiring not shown in the drawing.

As shown in FIG. 6, the imaging portion 102 is constituted with the portions provided on a substrate 204 such as a light-receiving element 201, a color filter 202, and a microlens 203. The color filter 202 has a blue pixel 205$b$, a red pixel 205$r$, a green pixel 205$g$, and a black matrix 205$bm$. The colored film according to the embodiment of the present invention can also be used as the black matrix 205$bm$.

As the material of the substrate 204, the same material as that of the chip substrate 106 can be used. On the surface layer of the substrate 204, a p-well layer 206 is formed. In the p-well layer 206, the light-receiving elements 201, which are formed of an n-type layer and generate and accumulate signal charges by photoelectric conversion, are arranged in the form of square grids.

On one lateral side of each light-receiving element 201, through a reading gate portion 207 on the surface layer of the p-well layer 206, a vertical electric charge transfer path 208 formed of an n-type layer is formed. Furthermore, on the other lateral side of each light-receiving element 201, through an element separation region 209 formed of a p-type layer, a vertical electric charge transfer path 208 belonging to the adjacent pixel is formed. The reading gate portion 207 is a channel region for the signal charges accumulated in the light-receiving element 201 to be read toward the vertical electric charge transfer path 208.

On the surface of the substrate 204, a gate insulating film 210 formed of an oxide-nitride-oxide (ONO) film is formed. On the gate insulating film 210, vertical electric charge transfer electrodes 211 formed of polysilicon or amorphous silicon are formed to cover the portions which are approximately immediately above the vertical electric charge transfer path 208, the reading gate portion 207, and the element separation region 209. The vertical electric charge transfer electrodes 211 function as driving electrodes for driving the vertical electric charge transfer path 208 and performing charge transfer and as reading electrodes for driving the reading gate portion 207 and reading out signal charges. The signal charges are transferred to a horizontal electric charge transfer path and an output portion (floating diffusion amplifier), which are not shown in the drawing, in this order from the vertical electric charge transfer path 208 and then output as voltage signals.

On each of the vertical electric charge transfer electrodes 211, a light blocking film 212 is formed to cover the surface of the electrode. The light blocking film 212 has an opening portion in a position immediately above the light-receiving element 201 and shields a region other than the opening portion from light. The colored film according to the embodiment of the present invention can also be used as the light blocking film 212.

On the light blocking film 212, a transparent interlayer is provided which is formed of an insulating film 213 formed of borophosphosilicate glass (BPSG), an insulating film (passivation film) 214 formed of P—SiN, and a planarization film 215 formed of a transparent resin or the like. The color filter 202 is formed on the interlayer.

(Black Matrix)

The black matrix includes the colored film according to the embodiment of the present invention. The black matrix is incorporated into a color filter, a solid-state imaging element, and a liquid crystal display device in some cases.

Examples of the black matrix include those described above; a black rim provided in the peripheral portion of a display device such as a liquid crystal display device; a grid-like and/or a stripe-like black portion between pixels of red, blue, and green; a dot-like and/or a linear black pattern for shielding a thin film transistor (TFT) from light; and the like. The definition of the black matrix is described in, for example, Yasuhira Kanno, "Glossary of Liquid Crystal display Manufacturing Device", $2^{nd}$ edition, NIKKAN KOGYO SHIMBUN, LTD., 1996, p. 64.

The manufacturing method of the black matrix is not particularly limited, and the black matrix can be manufactured by the same method as the manufacturing method of the colored film described above.

(Color Filter)

The color filter according to an embodiment of the present invention includes a colored film.

The aspect in which the color filter includes the colored film is not particularly limited, and examples thereof include a color filter comprising a substrate and the aforementioned black matrix. That is, examples of the color filter include a color filter comprising colored pixels of red, green, and blue formed on the opening portion of the black matrix formed on a substrate.

(Image Display Device)

The image display device according to an embodiment of the present invention includes a colored film. The aspect in which the image display device (typical examples thereof include a liquid crystal display device, hereinafter, the liquid crystal display device will be described) includes the colored film is not particularly limited, and examples thereof include an aspect in which the image display device includes a color filter including the black matrix (colored film) described above.

Examples of the liquid crystal display device according to the present embodiment include an aspect in which the liquid crystal display device comprises a pair of substrates disposed to face each other and a liquid crystal compound sealed into the space between the substrates. The substrates are as described above as the substrate for a black matrix.

Examples of a specific aspect of the liquid crystal display device include a laminate having polarizing plate/substrate/color filter/transparent electrode layer/alignment film/liquid crystal layer/alignment film/transparent electrode layer/Thin Film Transistor (TFT) element/substrate/polarizing plate/backlight unit in this order from the user's side.

The liquid crystal display device is not limited to the above, and examples thereof include the liquid crystal display devices described in "Electronic display device (Akio Sasaki, Kogyo Chosakai Publishing Co., Ltd., 1990)" and "Display Device (Sumiaki Ibuki, Sangyo Tosho Publishing Co., Ltd., 1989)" and the liquid crystal display device described in "Next-Generation Liquid Crystal Display Technology (Tatsuo Uchida, Kogyo Chosakai Publishing Co., Ltd., 1994)".

<Infrared Sensor>

The infrared sensor according to an embodiment of the present invention includes the aforementioned colored film.

The infrared sensor according to the embodiment will be described using FIG. 7. In an infrared sensor 300 shown in FIG. 7, the reference 310 represents a solid-state imaging element.

The imaging region provided on the solid-state imaging element 310 is constituted with a combination of an infrared absorption filter 311 and a color filter 312 according to the embodiment of the present invention.

The infrared absorption filter 311 is a film which transmits light of the range of visible rays and blocks light of the infrared range. In the infrared absorption filter 311, a colored film containing an infrared absorber (the aspect of the infrared absorber is as described above) as a colorant can be used.

The color filter 312 is a color filter in which pixels transmitting or absorbing light having a specific wavelength in the range of visible rays are formed. As the color filter 312, for example, a color filter in which pixels of red (R), green (G), and blue (B) are formed is used, and the aspect thereof is as described above.

Between an infrared transmission filter 313 and the solid-state imaging element 310, a resin film 314 (for example, a transparent resin film or the like) is disposed which can transmit light having a wavelength transmitted through the infrared transmission filter 313.

It is preferable that the infrared transmission filter 313 blocks light having a wavelength of 400 to 830 nm and transmits light having a wavelength of 900 to 1,300 nm, for example.

On an incidence ray hv side of the color filter 312 and the infrared transmission filter 313, microlenses 315 are arranged. A planarization film 316 is formed to cover the microlenses 315.

Figure 7:
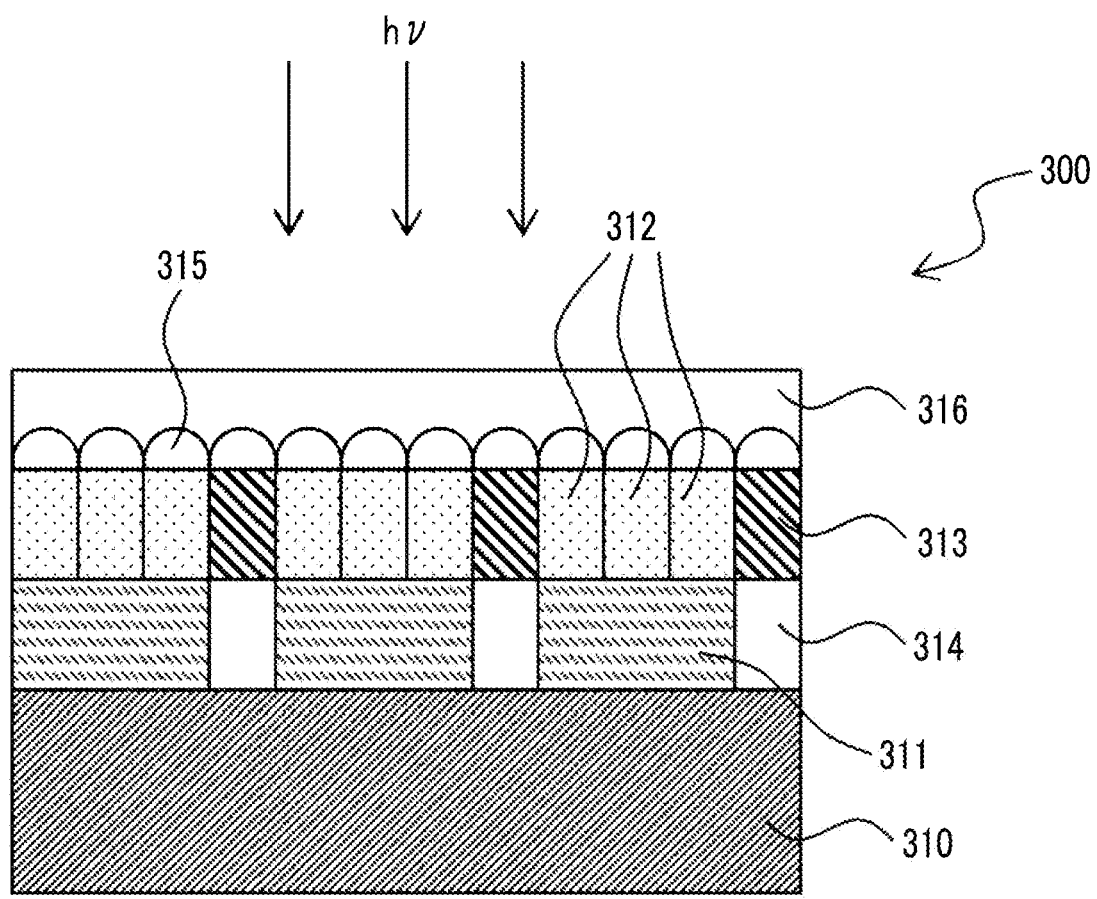
FIG. 7 is a schematic cross-sectional view showing a constitution example of an infrared sensor.

Although a resin film 314 is disposed in the embodiment shown in FIG. 7, the infrared transmission filter 313 may be formed instead of the resin film 314. That is, on the solid-state imaging element 310, the infrared transmission filter 313 may be formed.

In the embodiment shown in FIG. 7, the film thickness of the color filter 312 is the same as the film thickness of the infrared transmission filter 313. However, the film thicknesses may be different from each other.

In the embodiment shown in FIG. 7, the color filter 312 is provided to be closer to the incidence ray hv side than the infrared absorption filter 311. However, the order of the infrared absorption filter 311 and the color filter 312 may be switched such that the infrared absorption filter 311 is provided to be closer to the incidence ray hv side than the color filter 312.

In the embodiment shown in FIG. 7, the infrared absorption filter 311 and the color filter 312 are laminated to be adjacent to each other. However, these filters do not need to be adjacent to each other, and another layer may be provided between the filters. The colored film according to the embodiment of the present invention can be used as a light blocking film on the edge of the surface of the infrared absorption filter 311 or lateral surface of the infrared absorption filter 311. Furthermore, by being used as a device inner wall of an infrared sensor, the colored film according to the embodiment of the present invention can prevent internal reflection or unintended incidence of light on the light receiving portion and can improve sensitivity.

According to the infrared sensor, image information can be simultaneously input. Therefore, motion sensing by which a subject whose movement is to be detected is recognized can be carried out. Furthermore, because distance information can be obtained, images including 3D information and the like can be captured.

EXAMPLES

Hereinafter, the present invention will be more specifically described based on examples. The materials, the amount of the materials used, the proportion of the materials, the treatment content, the treatment procedure, and the like shown in the following examples can be appropriately modified as long as the gist of the present invention is maintained. Accordingly, the scope of the present invention is not limited to the following examples.

<Preparation of Titanium Black Dispersion Liquid>

Titanium oxide MT-150A (trade name, manufactured by TAYCA, 100 g) having an average particle diameter of 15 nm, 25 g of silica particles AEROSIL (registered trademark) (manufactured by Evonik Industries) having a BET specific surface area of 300 m$^2$/g, and 100 g of a dispersant Disperbyk 190 (trade name, manufactured by BYK Additives & Instruments) were weighed, 71 g of electric deionized water was added thereto, and by using MAZERUSTAR KK-400W manufactured by KURABO INDUSTRIES LTD., the mixture was treated for 20 minutes at a revolution frequency of 1,360 rotations per minute (rpm) and a rotation frequency of 1,047 rpm, thereby obtaining a homogenous aqueous solution. A quartz container was filled with the aqueous solution and heated to 920° C. in an oxygen atmosphere by using a compact rotary kiln (manufactured by MOTOYAMA). Then, by purging the atmosphere with nitrogen and allowing ammonia gas to flow at 100 mL/min for 5 hours at the same temperature, a nitriding reduction treatment was performed. After the treatment was finished, the collected powder was ground using a mortar, thereby obtaining powder-like titanium black (T-1) containing Si atoms and having a specific surface area of 73 m$^2$/g [substance to be dispersed containing titanium black particles and Si atoms].

Next, by mixing together the following components, a dispersion was obtained.

Titanium black (T-1): 25 parts by mass
30% by mass solution of propylene glycol monomethyl ether acetate containing the following resin (X-1): 25 parts by mass
Propylene glycol monomethyl ether acetate (PGMEA) (solvent): 23 parts by mass
Butyl acetate (BA) (solvent): 27 parts by mass In the following structural formulae, "43", "8", and "49" each represent a ratio (mol %) of the repeating units as a main agent to all the repeating units, and "20" represents the number of repeating moieties in a side chain.

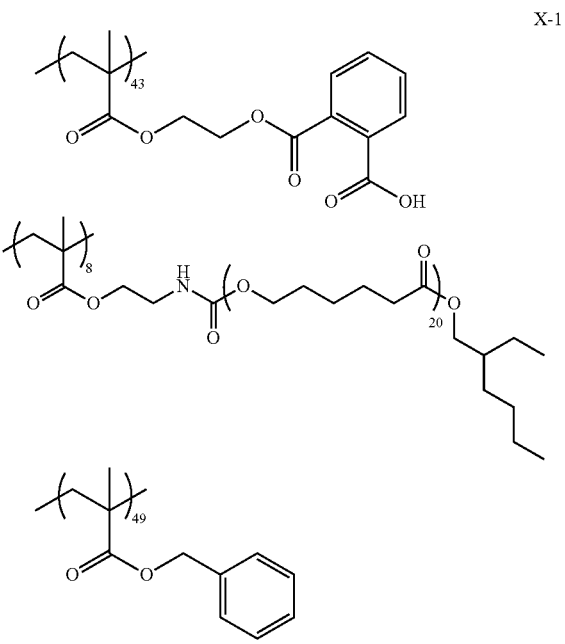

By using NPM Pilot manufactured by Shinmaru Enterprises Corporation, a dispersion treatment was performed on the obtained dispersion under the following condition, thereby obtaining a titanium black dispersion liquid.

(Dispersion Condition)
Bead size: ϕ0.05 mm
Bead filling rate: 65% by volume
Circumferential speed of mill: 10 m/sec
Circumferential speed of separator: 11 m/s
Amount of mixed solution subjected to dispersion treatment: 15.0 g
Circulation flow rate (pump feeding amount): 60 kg/hour
Treatment solution temperature: 20° C. to 25° C.
Coolant: 5° C. tap water
Internal volume of cyclic path of beads mill: 2.2 L
Number of times of pass: 84 passes <Preparation of Nanoimprint Lithography (NIL)-Type Composition for Forming Colored Film>

By mixing together the following components, an NIL-type composition for forming a colored film was prepared.

| | |
|---|---|
| Titanium black dispersion liquid | 45 parts by mass |
| Dicyclopentenyl acrylate (manufactured by Hitachi Chemical Co., Ltd.: FA-511AS) | 5.11 parts by mass |
| Neopentyl glycol diacrylate | 5.11 parts by mass |
| Irgacure OXE02 (manufactured by BASF SE) | 0.11 parts by mass |
| Fluorine-based surfactant (manufactured by Tohchem Products K.K.) | 0.03 parts by mass |

-continued

| | |
|---|---|
| Silicone-based surfactant (manufactured by DIC Corporation: MEGAFACE PEINTADDO 31) | 0.01 parts by mass |
| Phenothiazine | 0.003 parts by mass |

<Preparation of Negative Composition for Forming Colored Film>

By mixing together the following components, a negative composition for forming a colored film was prepared.

| | |
|---|---|
| Titanium black dispersion liquid | 73.00 parts by mass |
| Alkali-soluble resin: ACRYCURE RD-F8 (manufactured by NIPPON SHOKUBAI CO., LTD., solid contents: 40%, solvent: propylene glycol monomethyl ether) | 8.32 parts by mass |
| Irgacure OXE02 (manufactured by BASF Japan Ltd.) | 1.96 parts by mass |
| KAYARAD DPHA (trade name, manufactured by Nippon Kasei Chemical Co., Ltd, mixture of hexafunctional polymerizable compound (amount of ethylenically unsaturated groups: 10.4 mmol/g) and pentafunctional polymerizable compound (amount of ethylenically unsaturated groups: 9.5 mmol/g)) | 6.82 parts by mass |
| MEGAFACE F-781F (manufactured by DIC Corporation) | 0.02 parts by mass |
| Propylene glycol monomethyl ether acetate | 7.82 parts by mass |

<Preparation of Positive Composition for Forming Colored Film>

By mixing together the following composition, a positive composition for forming a colored film was prepared.

| | |
|---|---|
| Titanium black dispersion liqui | 45 parts by mass |
| Acid-decomposable group-containing resin P-6 | 11 parts by mass |
| Photoacid generator G-3 | 1 part by mass |
| Amine compound Q-1 | 0.04 parts by mass |
| Silane coupling agent C-1 | 0.5 parts by mass |
| MEGAFACE F-781F (manufactured by DIC Corporation) | 0.03 parts by mass |
| Solvent (cyclohexanone) | 20 parts by mass |
| Solvent (PGMEA) | 20 parts by mass |

Acid-decomposable group-containing resin P-6

"60" and "40" each represent a ratio (mol %) of each repeating unit to all the repeating units.

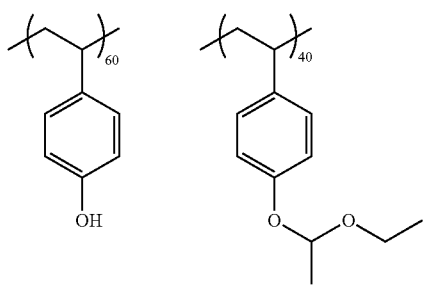

Photoacid Generator G-3

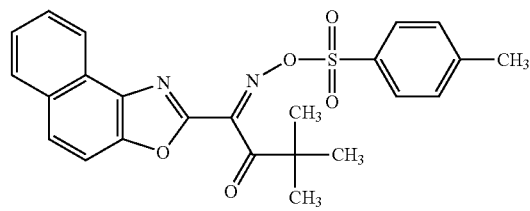 [SMILES: Cc1ccc(S(=O)(=O)O/N=C(\C(=O)C(C)(C)C)c2nc3c(ccc4ccccc43)o2)cc1]

Amine Compound Q-1

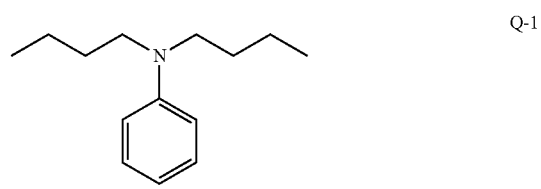

Silane Coupling Agent C-1

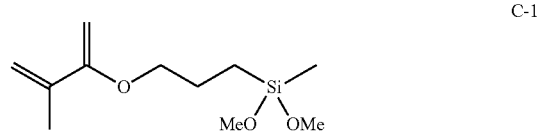

MEGAFACE F-781F (manufactured by DIC Corporation) (shown in the following structural formula, the ratios of the structural units represented by (A) and (B) in the formula are 62 mol % and 38 mol % respectively.)

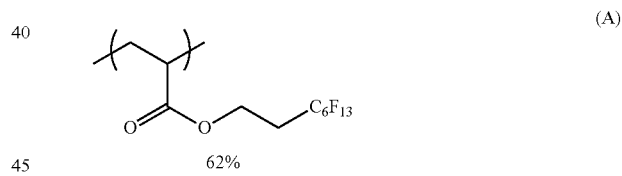

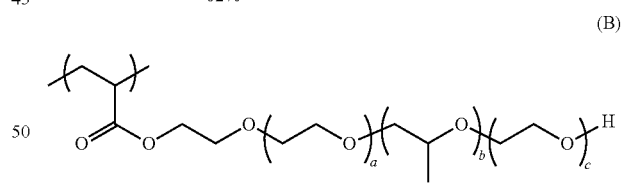

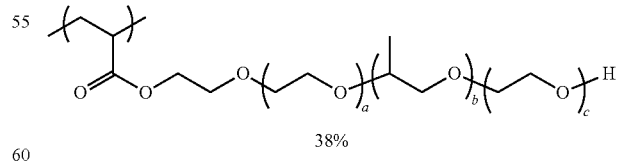

Examples 1 to 9 and Comparative Examples 1 to 4

By a spin coating method, a silicon substrate with 140 nm $SiO_2$ vapor-deposited on a surface layer thereof was coated with the NIL-type composition for forming a colored film such that the thickness of the coating film became 1.5 μm after curing. Then, in order to remove the solvent from the coating film, the coating film was dried for 2 minutes at 100° C. The silicon substrate having the above coating film was set in a nanoimprinting device using a high-pressure mercury lamp (lamp power: 2,000 mW/cm$^2$) manufactured by ORC MANUFACTURING CO., LTD. as a light source, a mold which had a predetermined shape and was formed of a quartz material was pressed on the coating film at a mold pressure of 0.8 kN, and the resultant was exposed from the mold surface at 1,000 mJ/cm$^2$ at a degree of vacuum of 10 Torr. After the exposure, the mold was separated from the coating film. Thereafter, by using AD-1200 (manufactured by MIKASA CO., LTD.) and a developer "FHD-5" (manufactured by FUJIFILM Electronics Materials), the exposed coating film was subjected to puddle development for 60 seconds. Subsequently, the coating film was rinsed with pure water for 20 seconds by using a shower nozzle such that the unexposed portion was removed, thereby obtaining colored films having the uneven shape described in Tables 1-1 and 1-3 on the surface thereof.

The mold used in Examples 1 to 9 and Comparative Examples 1 to 4 was prepared as below.

The surface of a substrate, which was obtained by forming a Cr film on a 50 mm×50 mm×1.0 mm quartz substrate, was coated with a chemical amplification-type positive resist (FEP 171: manufactured by FUJIFILM Electronics Materials), and the obtained coating film was prebaked, thereby forming a photoresist layer. Then, the photoresist layer was subjected to lithography by using an electron beam lithography device (JBX 9000: JEOL Ltd.) and then subjected to a development treatment, thereby forming a resist pattern on the surface of the quartz substrate. Thereafter, by using a resist film as a mask, the surface of the Cr film was dry-etched, and then the resist pattern was removed by using a stripper, thereby obtaining a quartz substrate with a Cr film disposed on a predetermined position.

Subsequently, by using the Cr film disposed on a predetermined position as a mask, the surface of the quartz substrate was dry-etched, thereby forming a mold (of imprinting type).

By adjusting the position where the Cr film was disposed, the distance between adjacent projections in the uneven structure of the colored film and the standard deviation of the distance were changed. Furthermore, by changing the etching time and the thickness of the Cr film, 3h/P of the projections was changed.

Example 10

By a spin coating method, a silicon substrate with a SiO$_2$ layer having a film thickness of 140 nm vapor-deposited on a surface layer thereof was coated with the negative composition for forming a colored film, and then by using a hot plate with 100° C., the substrate was heated (prebaked) for 120 seconds. Thereafter, by using an i-line stepper exposure machine FPA-3000i5+(manufactured by Canon Inc.), the coating film was exposed through a mask having the pattern described in Table 1-2. Subsequently, by using AD-1200 (manufactured by MIKASA CO., LTD.) and a developer "FHD-5" (manufactured by FUJIFILM Electronics Materials), the exposed coating film was subjected to puddle development for 60 seconds. Then, the coating film was rinsed with pure water for 20 seconds by using a shower nozzle such that the unexposed portion was removed, thereby obtaining colored films having the uneven shape described in Table 1-2 on the surface thereof.

Example 11

By a spin coating method, a silicon substrate with a SiO$_2$ layer having a film thickness of 140 nm vapor-deposited on a surface layer thereof was coated with the negative composition for forming a colored film, and then by using a hot plate with 100° C., the substrate was heated (prebaked) for 120 seconds. Thereafter, by using an i-line stepper exposure machine FPA-3000i5+(manufactured by Canon Inc.), the coating film was exposed in an exposure amount of 2,000 mJ/cm$^2$. Subsequently, the exposed coating film was coated with a positive photoresist "FHi-622BC" (manufactured by FUJIFILM Electronics Materials) and pre-baked, thereby forming a photoresist layer having a film thickness of 2.0 μm. Then, the photoresist layer was exposed through a mask having opening portions in predetermined positions. A heating treatment was then performed for 1 minute on the photoresist layer at the temperature of the photoresist layer or at a temperature by which the atmospheric temperature became 90° C. Thereafter, a development treatment was performed for 1 minute by using a developer "FHD-5" (manufactured by FUJIFILM Electronics Materials), and a post-baking treatment was performed for 1 minute at 110° C., thereby forming a resist pattern. Dry etching was then performed according to the following procedure. By using a dry etching device (manufactured by Hitachi High-Technologies Corporation, U-621), an etching treatment was performed for 180 seconds under the condition of an RF power: 800 W, antenna bias: 400 W, wafer bias: 250 W, internal pressure of chamber: 0.5 Pa, substrate temperature: 50° C., type and flow rate of mixed gas: 350 mL/min for CF$_4$ and 50 mL/min for C$_4$F$_6$, thereby obtaining colored films having the uneven shape described in Table 1-2 on the surface thereof. At the time of dry etching, the resist pattern was also removed.

Examples 12 to 17

By a spin coating method, a silicon substrate with a SiO$_2$ layer having a film thickness of 140 nm vapor-deposited on a surface layer thereof was coated with the positive composition for forming a colored film, and then by using a hot plate with 100° C., the substrate was heated (prebaked) for 120 seconds. Thereafter, by using an i-line stepper exposure machine FPA-3000i5+(manufactured by Canon Inc.), the coating film was exposed through a mask so as to obtain the pattern described in Table 1-2. Subsequently, by using AD-1200 (manufactured by MIKASA CO., LTD.) and a developer "FHD-5" (manufactured by FUJIFILM Electronics Materials), the exposed coating film was subjected to puddle development for 60 seconds and spin-dried, thereby obtaining colored films having the uneven shape described in Tables 1-2 on the surface thereof.

<Evaluation of Reflectance>

By using a spectroscope V7200 (trade name) VAR unit manufactured by JASCO Corporation, light having a wavelength of 500 nm was allowed to be incident on the prepared colored film at an incidence angle of 5°, and the reflectance was measured and evaluated according to the following standards. For practical use, "A" or "B" is preferable.

"A": the reflectance was less than 2%.

"B": the reflectance was equal to or higher than 2% and less than 4%.

"C": the reflectance was equal to or higher than 4%.

<Evaluation of Light Fastness>

By using a xenon weather meter NX75 (manufactured by Suga Test Instruments Co., Ltd.), the prepared light blocking film was irradiated at 5,000,000 Lux·h under the condition of irradiance of 75 W/m², internal temperature of tank of 47° C., and humidity of 50%, and the reflectance thereof after the light irradiation was evaluated according to the same procedure as that in <Evaluation of light fastness>.

The change in reflectance described below was calculated by (reflectance after light irradiation)−(reflectance before light irradiation).

"AA": the change in reflectance before and after the light fastness test was less than 0.5%.

"A": the change in reflectance before and after the light fastness test was equal to or greater than 0.5% and less than 1%.

"B": the change in reflectance before and after the light fastness test was equal to or greater than 1% and less than 2%.

"C": the change in reflectance before and after the light fastness test was equal to or greater than 2%.

The colored films obtained in the above examples had an optical density equal to or higher than 1.0 per thickness of 1.0 μm at all the wavelengths in a wavelength range of 400 to 700 nm.

Furthermore, the projections in the uneven structure on the surface of each of the colored films obtained in the above examples had a conical shape.

In the tables, the column of "Average height h" shows the average height of projections.

The column of "Average of 3h/D" shows the average of 3h/D of projections.

The column of "Number of defects" shows the density of projections which do not satisfy Formula (1).

">99.0%" means that the proportion is higher than 99.0% and less than 100%.

In each of the examples, the number of projections was within a range of $1.0 \times 10^5$ to $1.0 \times 10^{15}$/cm².

TABLE 1-1

| | | Example 1 | Example 2 | Example 3 | Example 4 | Example 5 | Example 6 | Example 7 | Example 8 | Example 9 |
|---|---|---|---|---|---|---|---|---|---|---|
| Colored film | Type of composition | NIL-type composition for forming colored film | | | | | | | | |
| | Arrangement position of projections | Hexagonal (see FIG. 2) | | | | | | | | |
| | Average distance between adjacent projections (nm) | 900 | 600 | 300 | 200 | 600 | 600 | 600 | 600 | 600 |
| | Standard deviation of distance between adjacent projections (nm) | 50 | 50 | 50 | 50 | 25 | 12 | 50 | 50 | 50 |
| | Proportion of projections satisfying Formula (1) (%) | >99.0% | >99.0% | >99.0% | >99.0% | >99.0% | >99.0% | >99.0% | >99.0% | >99.0% |
| | Average height h (nm) | 300 | 300 | 300 | 300 | 300 | 300 | 300 | 300 | 300 |
| | Average of 3 h/D | 1.0 | 1.5 | 3.0 | 4.5 | 1.5 | 1.5 | 1.5 | 1.5 | 1.5 |
| | Number of defects (number/cm²) | 5 | 5 | 5 | 9 | 5 | 4 | 12 | 1 | 0 |
| Result | Reflectance | B | A | A | A | A | A | B | A | A |
| | Light fastness | AA | AA | AA | AA | A | B | B | A | B |

TABLE 1-2

| | | Example 10 | Example 11 | Example 12 | Example 13 | Example 14 | Example 15 | Example 16 | Example 17 |
|---|---|---|---|---|---|---|---|---|---|
| Colored film | Type of composition | Negative composition for forming colored film | | Positive composition for forming colored film | | | | | |
| | Arrangement position of projections | | | Hexagonal (see FIG. 2) | | | | Checkered pattern (see FIG. 3) | Island (see FIG. 4) |
| | Average distance between adjacent projections (nm) | 600 | 600 | 900 | 900 | 600 | 1500 | 600 | 600 |
| | Standard deviation of distance between adjacent projections (nm) | 50 | 50 | 50 | 50 | 50 | 50 | 50 | 50 |
| | Proportion of projections satisfying Formula (1) (%) | >99.0% | >99.0% | >99.0% | >99.0% | >99.0% | >99.0% | >99.0% | >99.0% |
| | Exposure amount (mJ/cm²) | 200 | 200 | 1,500 | 2,500 | 1,500 | 2,500 | 1,500 | 1,500 |
| | Average height h (nm) | 200 | 300 | 300 | 500 | 300 | 500 | 300 | 300 |
| | Average of 3 h/D | 1.0 | 1.5 | 1.0 | 1.7 | 1.5 | 1.0 | 1.5 | 1.5 |
| | Number of defects (number/cm²) | 5 | 8 | 5 | 5 | 5 | 2 | 0 | 0 |
| Result | Reflectance | B | A | B | A | A | B | B | B |
| | Light fastness | AA | AA | AA | AA | AA | A | B | B |

TABLE 1-3

| | | Comparative Example 1 | Comparative Example 2 | Comparative Example 3 | Comparative Example 4 |
|---|---|---|---|---|---|
| Colored film | Type of composition | NIL-type composition for forming colored film | | | |
| | Arrangement position of projections | Hexagonal (see FIG. 2) | | | |
| | Average distance between adjacent projections (nm) | 1,500 | 2,000 | 600 | 600 |
| | Standard deviation of distance between adjacent projections (nm) | 50 | 50 | 7 | 400 |
| | Proportion of projections satisfying Formula (1) (%) | 91.1% | >99.0% | >99.0% | >99.0% |
| | Average height h (nm) | 490 | 700 | 300 | 300 |
| | Average of 3 h/D | 0.98 | 1.05 | 1.5 | 1.5 |
| | Number of defects (number/cm$^2$) | ≥1000 | 5 | 6 | 6 |
| Result | Reflectance | C | C | A | C |
| | Light fastness | B | A | C | A |

As shown in the tables, the colored film of the present invention had desired effects.

Particularly, through the comparison between Example 1 and Example 2, it was confirmed that the effects are further improved in a case where the average of 3h/D is equal to or greater than 1.3.

Through the comparison between Example 5 and Example 6, it was confirmed that in the effects are further improved in a case where the standard deviation of the distance between projections is equal to or greater than 15 nm (preferably equal to or greater than 30 nm).

Through the comparison of Examples 2 and 7 to 9, it was confirmed that the effects are further improved in a case where the number of projections that do not satisfy Formula (1) is 0.01 to 10/cm$^2$ (preferably 2 to 10/cm$^2$).

Example 18

A colored film was obtained according to the same procedure as in Example 2, except that in the NIL-type composition for forming a colored film, carbon black (trade name "CARBON BLACK S170", manufactured by Degussa AG, average primary particle diameter: 17 nm, Brunauer, Emmett, Teller (BET) specific surface area: 200 m$^2$/g, carbon black manufactured by a gas black method) was used instead of the titanium black (T-1).

As a result of evaluating the obtained colored film, the same results as in Example 2 were obtained.

Example 19

A colored film was obtained according to the same procedure as in Example 2, except that in the NIL-type composition for forming a colored film, a colorant (Pigment Yellow 150, manufactured by Hangzhou Star-up Pigment Co., Ltd., trade name: 6150 PIGMENT YELLOW 5GN) was used instead of the titanium black (T-1).

As a result of evaluating the obtained colored film, the same results as in Example 2 were obtained.

Example 20

A colored film was obtained according to the same procedure as in Example 2, except that the following I-1 was used instead of IRGACURE OXE02 (manufactured by BASF SE).

As a result of evaluating the obtained colored film, the same results as in Example 2 were obtained.

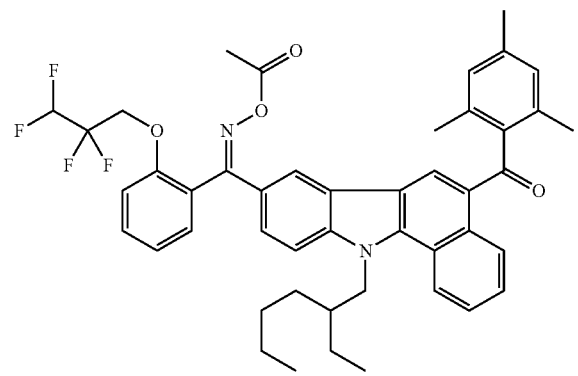

I-1

Example 21

A colored film was obtained according to the same procedure as in Example 1, except that a compound shown in the following formula was used instead of IRGACURE OXE02 (manufactured by BASF SE).

As a result of evaluating the obtained colored film, the same results as in Example 1 were obtained.

The following compound corresponds to the compound (oxime-based polymerization initiator) represented by OE74 in WO2015/036910.

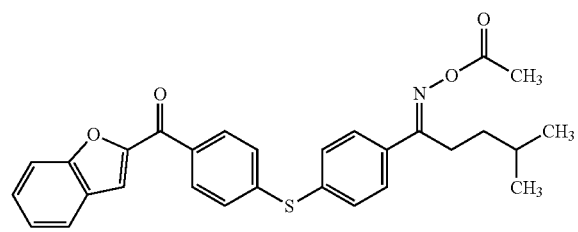 [SMILES: CC(=O)O/N=C(\CCC(C)C)c1ccc(Sc2ccc(C(=O)c3cc4ccccc4o3)cc2)cc1]

Example 22

A colored film was obtained according to the same procedure as in Example 1, except that surfactants (a fluorine-based surfactant and a silicone-based surfactant) were not used.

As a result of evaluating the obtained colored film, the same results as in Example 1 were obtained.

Example 23

A colored film was obtained according to the same procedure as in Example 1, except that a polymerization inhibitor (phenothiazine) was not used.

As a result of evaluating the obtained colored film, the same results as in Example 1 were obtained.

Example 24

A colored film was obtained according to the same procedure as in Example 1, except that as a polymerizable compound, in addition to dicyclopentenyl acrylate, a composition constituted with KAYARAD DPHA (dipentaerythritol hexaacrylate, manufactured by Nippon Kayaku Co., Ltd.) and PET-30 (pentaerythritol triacrylate, manufactured by Nippon Kayaku Co., Ltd.) at a mass ratio of 1:1 was used.

As a result of evaluating the obtained colored film, the same results as in Example 1 were obtained.

EXPLANATION OF REFERENCES

- 10: colored film
- 12, 12a, 12b, 12c: projection
- 20: substrate
- 100: solid-state imaging device
- 101: solid-state imaging element
- 102: imaging portion
- 103: cover glass
- 104: spacer
- 105: laminated substrate
- 106: chip substrate
- 107: circuit substrate
- 108: electrode pad
- 109: external connection terminal
- 110: penetration electrode
- 111: lens layer
- 112: lens material
- 113: support
- 114, 115: light blocking film
- 201: light-receiving element
- 202: color filter
- 203: microlens
- 204: substrate
- 205b: blue pixel
- 205r: red pixel
- 205g: green pixel
- 205bm: black matrix
- 206: p-well layer
- 207: reading gate portion
- 208: vertical electric charge transfer path
- 209: element separation region
- 210: gate insulating film
- 211: vertical electric charge transfer electrode
- 212: light blocking film
- 213, 214: insulating film
- 215: planarization film
- 300: infrared sensor
- 310: solid-state imaging element
- 311: infrared absorption filter
- 312: color filter
- 313: infrared transmission filter
- 314: resin film
- 315: microlens
- 316: planarization film

What is claimed is:

1. A colored film comprising an uneven structure on a surface,
    wherein an average distance between adjacent projections in the uneven structure is equal to or shorter than 1,500 nm,
    a standard deviation of the distance between the adjacent projections is 10 to 300 nm,
    95.0% or more of the projections satisfy Formula (1),
    Formula (1) $3h/D \geq 1.0$,
    in Formula (1), h represents a height of the projections, and D represents the average distance between the adjacent projections,
    the uneven structure has projections that do not satisfy the requirement of Formula (1), and
    a density of the projections that do not satisfy the requirement of Formula (1) is 0.01 to 10/cm$^2$.

2. The colored film according to claim 1, wherein an optical density per thickness of 1.0 µm is equal to or higher than 0.5 at a wavelength within a wavelength range of 400 to 700 nm.

3. The colored film according to claim 1, wherein the average distance between the adjacent projections is 200 to 1,500 nm.

4. The colored film according to claim 1, wherein the standard deviation of the distance between the adjacent projections is 15 to 300 nm.

5. The colored film according to claim 1, wherein the standard deviation of the distance between the adjacent projections is 30 to 300 nm.

6. The colored film according to claim 1, wherein an average of 3h/D of the projections is equal to or greater than 1.3.

7. The colored film according to claim 1, wherein the projections have a shape tapered toward the tip.

8. The colored film according to claim 1 that is used as a light blocking film on a photosensor.

9. A manufacturing method of the colored film according to claim 1, comprising:
    forming the colored film by a nanoimprinting method or a photolithography method.

10. The manufacturing method of the colored film according to claim 9,
    wherein the colored film is formed by the photolithography method, and a positive composition for forming a colored film is used.

11. The manufacturing method of the colored film according to claim 9,
    wherein the colored film is formed by the photolithography method, and exposure is performed through a mask having hexagonally arranged opening portions.

12. A solid-state imaging element comprising:
    the colored film according to claim 1.

* * * * *